(12) United States Patent
Kouno

(10) Patent No.: US 7,974,138 B2
(45) Date of Patent: *Jul. 5, 2011

(54) SEMICONDUCTOR MEMORY DEVICE

(75) Inventor: Kazuyuki Kouno, Osaka (JP)

(73) Assignee: Panasonic Corporation, Osaka (JP)

( * ) Notice: Subject to any disclaimer, the term of this patent is extended or adjusted under 35 U.S.C. 154(b) by 28 days.

This patent is subject to a terminal disclaimer.

(21) Appl. No.: 12/491,658

(22) Filed: Jun. 25, 2009

(65) Prior Publication Data
US 2009/0257293 A1 Oct. 15, 2009

Related U.S. Application Data

(62) Division of application No. 11/889,130, filed on Aug. 9, 2007, now Pat. No. 7,564,726.

(30) Foreign Application Priority Data

Aug. 11, 2006 (JP) ................... 2006-220360

(51) Int. Cl.
*G11C 7/10* (2006.01)
(52) U.S. Cl. .................. 365/189.08; 365/63; 365/210.1; 365/214; 365/230.03; 365/230.06; 365/189.07; 365/231
(58) Field of Classification Search ............. 365/189.08, 365/63, 210.01, 214, 230.03, 230.06, 189.07, 365/231
See application file for complete search history.

(56) References Cited

U.S. PATENT DOCUMENTS

| | | | |
|---|---|---|---|
| 5,943,286 A | 8/1999 | Orita | |
| 6,310,809 B1 | 10/2001 | Roohparvar et al. | |
| 6,339,556 B1 | 1/2002 | Watanabe | |
| 6,347,059 B2 | 2/2002 | Böhm et al. | |
| 6,359,821 B1 | 3/2002 | Roohparvar | |
| 6,525,969 B1 | 2/2003 | Kurihara et al. | |
| 6,621,744 B2 | 9/2003 | Kojima | |
| 6,707,742 B2 | 3/2004 | Kamei et al. | |
| 6,744,667 B2 * | 6/2004 | Yamamoto et al. | 365/185.16 |
| 7,009,880 B1 | 3/2006 | Liu | |
| 7,027,317 B2 | 4/2006 | Campardo et al. | |
| 7,095,655 B2 | 8/2006 | Betser et al. | |
| 7,123,510 B2 * | 10/2006 | Kojima et al. | 365/189.15 |
| 7,126,853 B2 | 10/2006 | Kim | |
| 7,149,110 B2 | 12/2006 | Tran et al. | |
| 7,154,787 B2 | 12/2006 | Omoto | |

(Continued)

FOREIGN PATENT DOCUMENTS

JP 2001-307494 11/2001

(Continued)

*Primary Examiner* — Viet Q Nguyen
(74) *Attorney, Agent, or Firm* — McDermott Will & Emery LLP

(57) ABSTRACT

A semiconductor memory device includes a selector line selection circuit for selecting, in a read operation, a selector line for connecting a first main bit line connected to the sense amplifier with a sub-bit line to which the memory cell being read is connected, a selector line for connecting the first main bit line with a sub-bit line of at least one sector different from the sector to which the memory cell being read belongs, a selector line for connecting a second main bit line connected to the sense amplifier with a sub-bit line to which the reference cell is connected, and a selector line for connecting the second main bit line with a sub-bit line of at least one sector different from the sector to which the memory cell being read belongs.

6 Claims, 14 Drawing Sheets

U.S. PATENT DOCUMENTS

| | | | |
|---|---|---|---|
| 7,239,571 B2 * | 7/2007 | Tanaka .................... | 365/230.03 |
| 7,408,820 B2 * | 8/2008 | Maruyama et al. ...... | 365/189.16 |
| 7,466,594 B2 | 12/2008 | Sofer et al. | |
| 7,564,726 B2 * | 7/2009 | Kouno .................... | 365/189.15 |
| 7,616,488 B2 * | 11/2009 | Kojima et al. ........... | 365/185.16 |
| 2005/0180212 A1 | 8/2005 | Kojima et al. | |
| 2005/0265107 A1 | 12/2005 | Tanaka | |

FOREIGN PATENT DOCUMENTS

| | | |
|---|---|---|
| JP | 2004-110872 | 4/2004 |
| JP | 2005-228446 | 8/2005 |

* cited by examiner

FIG.7
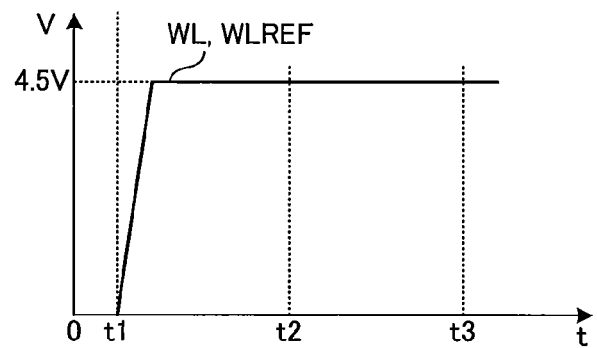
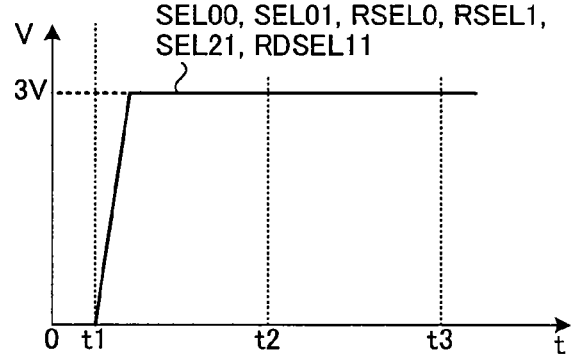
FIG.8A
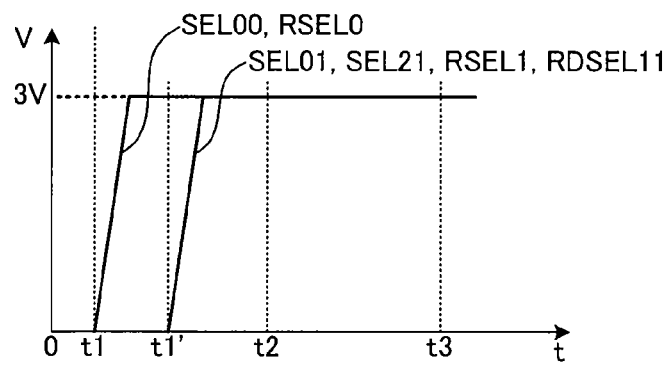
FIG.8B

FIG.10

| Accessed sector | Memory cell | | Reference cell | |
|---|---|---|---|---|
| | Drain main bit line | Source main bit line (Sensing node) | Drain main bit line | Source main bit line (Sensing node) |
| Sector 0 (64KB) | Sector 0 (64KB) | Sector 0/Sector 2 (64KB/8KB) | Reference Sector (8KB) | Reference Sector/Sector1 (8KB/64KB) |
| Sector 1 (64KB) | Sector 1 (64KB) | Sector 1/Sector 2 (64KB/8KB) | Reference Sector (8KB) | Reference Sector/Sector0 (8KB/64KB) |
| Sector 2 (8KB) | Sector 2 (8KB) | Sector 2/Sector 3 (8KB/8KB) | Reference Sector (8KB) | Reference Sector/Sector3 (8KB/8KB) |
| Sector 3 (8KB) | Sector 3 (8KB) | Sector 3/Sector 2 (8KB/8KB) | Reference Sector (8KB) | Reference Sector/Sector2 (8KB/8KB) |
| Sector 4 (16KB) | Sector 4 (16KB) | Sector 4/Sector 2 (16KB/8KB) | Reference Sector (8KB) | Reference Sector/Sector5 (8KB/16KB) |
| Sector 5 (16KB) | Sector 5 (16KB) | Sector 5/Sector 2 (16KB/8KB) | Reference Sector (8KB) | Reference Sector/Sector4 (8KB/16KB) |
| Sector 6 (32KB) | Sector 6 (32KB) | Sector 6/Sector 2 (32KB/8KB) | Reference Sector (8KB) | Reference Sector/Sector7 (8KB/32KB) |
| Sector 7 (32KB) | Sector 7 (32KB) | Sector 7/Sector 2 (32KB/8KB) | Reference Sector (8KB) | Reference Sector/Sector6 (8KB/32KB) |

FIG.11

| Accessed sector | Memory cell | | Reference cell | |
|---|---|---|---|---|
| | Drain main bit line | Source main bit line (Sensing node) | Drain main bit line | Source main bit line (Sensing node) |
| Sector0 (64KB) | Sector0 (64KB) | Sector0/Sector2 (64KB/8KB) | Reference Sector (8KB) | Reference Sector/Sector1 (8KB/64KB) |
| Sector1 (64KB) | Sector1 (64KB) | Sector1/Sector2 (64KB/8KB) | Reference Sector (8KB) | Reference Sector/Sector0 (8KB/64KB) |
| Sector2 (8KB) | Sector2 (8KB) | Sector2/Sector0 (8KB/64KB) | Reference Sector (8KB) | Reference Sector/Sector1 (8KB/64KB) |
| Sector3 (8KB) | Sector3 (8KB) | Sector3/Sector0 (8KB/64KB) | Reference Sector (8KB) | Reference Sector/Sector1 (8KB/64KB) |
| Sector4 (16KB) | Sector4 (16KB) | Sector4/Sector5/Sector6/Sector2 (16KB/16KB/32KB/8KB) | Reference Sector (8KB) | Reference Sector/Sector1 (8KB/64KB) |
| Sector5 (16KB) | Sector5 (16KB) | Sector5/Sector4/Sector6/Sector2 (16KB/16KB/32KB/8KB) | Reference Sector (8KB) | Reference Sector/Sector1 (8KB/64KB) |
| Sector6 (32KB) | Sector6 (32KB) | Sector6/Sector7/Sector2 (32KB/32KB/8KB) | Reference Sector (8KB) | Reference Sector/Sector1 (8KB/64KB) |
| Sector7 (32KB) | Sector7 (32KB) | Sector7/Sector6/Sector2 (32KB/32KB/8KB) | Reference Sector (8KB) | Reference Sector/Sector1 (8KB/64KB) |

SEMICONDUCTOR MEMORY DEVICE

CROSS REFERENCE TO RELATED APPLICATION

This application is a divisional of U.S. patent application Ser. No. 11/889,130, filed on Aug. 9, 2007 now U.S. Pat. No. 7,564,726 which claims priority under 35 U.S.C. §119 on Japanese Patent Application No. 2006-220360 filed in Japan on Aug. 11, 2006, the entire contents of each of which are hereby incorporated by reference.

BACKGROUND OF THE INVENTION

1. Field of the Invention

The present invention relates to a semiconductor memory device, and more particularly to a technique for adjusting a capacitance of a bit line in a read operation.

2. Description of the Background Art

A read operation of a conventional semiconductor memory device shown in FIGS. 3 and 4 of Japanese Laid-Open Patent Publication No. 2005-228446 will be outlined below.

The conventional semiconductor memory device includes a plurality of memory cells and a reference cell.

A certain amount of current flows through a memory cell that has been selected as a cell to be read, and the amount of current depends on whether data stored therein is "1" or "0". Therefore, the potential of a main bit line connected to a memory cell being read also depends on whether data stored in the memory cell is "0" or "1".

The reference cell is designed so that an intermediate amount of current flows through the reference cell, wherein the intermediate amount of current is between the amount of current that flows through a memory cell storing "1" therein and the amount of current that flows through a memory cell storing "0" therein. An intermediate potential is produced along a complementary main bit line connected to a reference cell in a read operation, wherein the intermediate potential is between the potential produced along a main bit line connected to a memory cell storing "0" and that produced along a main bit line connected to a memory cell storing "1".

Then, the potential along the main bit line to which the memory cell is connected and the potential along the complementary main bit line to which the reference cell is connected are amplified by a sense amplifier.

It is preferred that the total parasitic capacitance of the main bit line to which the memory cell is connected and that of the complementary main bit line to which the reference cell is connected are equal to each other. If the parasitic capacitances are different from each other, the amount of delay since the selection of a memory cell until a potential according to the data stored therein is produced along a main bit line connected to the memory cell will be different from the amount of delay since the selection of a reference cell until the intermediate potential is produced along a complementary main bit line connected to the reference cell. As a result, data will not be read accurately.

With the conventional semiconductor memory device, in order to balance the parasitic capacitance, a sub-bit line of a sector different from a sector including a memory cell being read is connected to a complementary main bit line that is connected to the reference cell. For example, when data is read out from a memory cell MC00 of the sector 0, a sub-bit line DBL1c of the sector 1, in addition to a sub-bit line RDBL0c, is connected to a complementary main bit line MBLc that is connected to a reference cell RC0n. In FIG. 4 of the above-identified patent document, the parasitic capacitance C1 and the parasitic capacitance C4 are substantially equal to each other, and the parasitic capacitance C3 and the parasitic capacitance C2 are substantially equal to each other, with the parasitic capacitance C9 being small. Therefore, the total parasitic capacitance C1+C3 of the main bit line MBLa and the total parasitic capacitance C4+C9+C2 of the complementary main bit line MBLc are substantially equal to each other.

Japanese Laid-Open Patent Publication No. 2004-110872 discloses a technique for coupling a load capacitance according to the address of the memory cell being read to a bit line that is connected to the reference cell.

Japanese Laid-Open Patent Publication No. 2001-307494 discloses a technique in which a reference load circuit is provided for each of a plurality of blocks each including a memory cell array, whereby the same load is applied to the reference signal as that applied to data being read out from the memory cell array.

However, with the semiconductor memory device shown in FIGS. 3 and 4 of Japanese Laid-Open Patent Publication No. 2005-228446, when the parasitic capacitance of the sub-bit line connected to the reference cell is large, the difference between the total parasitic capacitance of the main bit line and that of the complementary main bit line is large. For example, in the above case where data is read out from a memory cell MC00 of the sector 0, if the parasitic capacitance C9 of the sub-bit line RDBL0c connected to the reference cell is large, the difference between the total parasitic capacitance C1+C3 of the main bit line MBLa and the total parasitic capacitance C4+C9+C2 of the complementary main bit line MBLc is large. If the difference between the total parasitic capacitance of the main bit line to which the memory cell is connected and that of the complementary main bit line to which the reference cell is connected is large, data cannot be read accurately.

This problem does not occur if the parasitic capacitance of the sub-bit line, which is connected to the complementary main bit line in order to balance the total parasitic capacitance, is made smaller than the parasitic capacitance of the sub-bit line, which is connected to the memory cell being read, by the parasitic capacitance of the sub-bit line connected to the reference cell. However, the number of word lines of the sector including the sub-bit line, which is connected to the complementary main bit line in order to balance the total parasitic capacitance, will then be an undesirable odd number, which will be inconvenient and impractical to users who use the semiconductor memory device.

SUMMARY OF THE INVENTION

It is an object of the present invention to provide a semiconductor memory device from which data can be read accurately.

In order to achieve the object set forth above, a semiconductor memory device according to a first embodiment of the present invention includes:

a memory cell array including a plurality of memory cells arranged in a row direction and in a column direction to thereby form a matrix pattern, the memory cell array being divided into a plurality of sectors;

a plurality of word lines each provided for one row of memory cells;

a plurality of main bit lines extending in the column direction;

a plurality of sub-bit lines extending in the column direction and each provided within a sector;

a plurality of selection transistors corresponding to the sub-bit lines for electrically controlling connections between the main bit lines and the sub-bit lines;

a plurality of selector lines for controlling a conductivity state of the selection transistors;

a reference cell for producing a reference voltage used in a read operation;

a sense amplifier, to which the main bit lines are connected, for determining readout data;

a word line selection circuit for selecting a word line to which one of the memory cells that is being read is connected and a word line to which the reference cell is connected; and a selector line selection circuit for selecting, in a read operation, a selector line for connecting a first main bit line connected to the sense amplifier with a sub-bit line to which the memory cell being read is connected, a selector line for connecting the first main bit line with a sub-bit line of at least one sector different from a sector to which the memory cell being read belongs, a selector line for connecting a second main bit line connected to the sense amplifier with a sub-bit line to which the reference cell is connected, and a selector line for connecting the second main bit line with a sub-bit line of at least one sector different from the sector to which the memory cell being read belongs.

BRIEF DESCRIPTION OF THE DRAWINGS

FIG. 7 is a timing diagram showing a voltage waveform of a word line in a read operation of the semiconductor memory device according to Embodiment 1 of the present invention.

FIGS. 8A and 8B are timing diagrams each showing a voltage waveform of a selector line in a read operation of the semiconductor memory device according to Embodiment 1 of the present invention.

FIG. 10 is a diagram showing a sector including a sub-bit line connected to a main bit line in a read operation of the semiconductor memory device according to Embodiment 1 of the present invention.

FIG. 11 is a diagram showing a sector including a sub-bit line connected to a main bit line in a read operation of a semiconductor memory device according to Embodiment 2 of the present invention.

DETAILED DESCRIPTION OF THE PREFERRED EMBODIMENT

Figure 1:
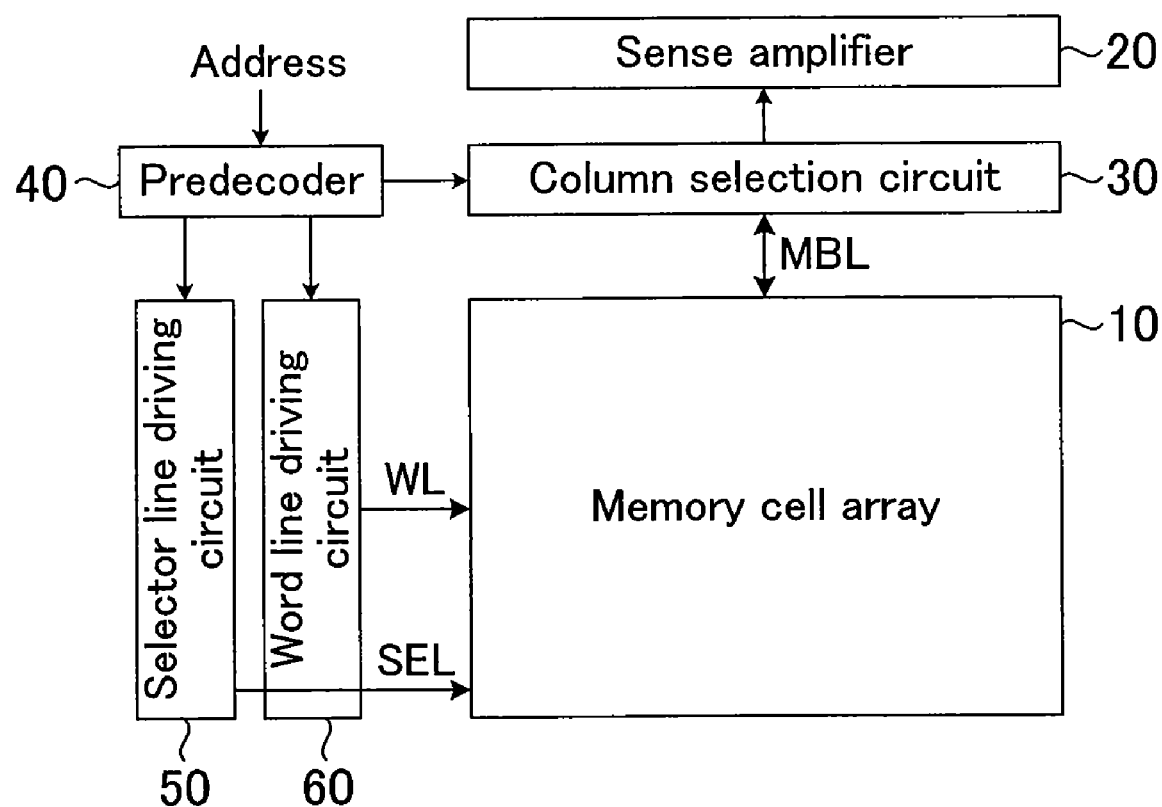
FIG. 1 is a block diagram showing a configuration of a semiconductor memory device according to Embodiment 1 of the present invention.

Embodiments of the present invention will now be described with reference to the drawings. In each of the following embodiments, elements similar in function to those of other embodiments will be denoted by the same reference numerals and will not be discussed repeatedly.

Embodiment 1

General Configuration of Semiconductor Memory Device

FIG. 1 is a block diagram showing a configuration of a semiconductor memory device according to Embodiment 1 of the present invention.

The semiconductor memory device includes a memory cell array 10, a sense amplifier 20, a column selection circuit 30, a predecoder 40, a selector line driving circuit 50, a word line driving circuit 60, and a bit line voltage supply circuit 21 (not shown in FIG. 1).

The memory cell array 10 is divided into a plurality of sectors. The memory cell array 10 includes a plurality of memory cells arranged in a matrix pattern (in rows and columns).

The sense amplifier 20 is a circuit for determining the readout data.

The column selection circuit 30 is a circuit for selecting a main bit line from among a plurality of main bit lines MBL so as to connect the selected main bit line to the sense amplifier 20.

The predecoder 40 is a circuit for receiving an input address to output an internal predecoded signal, which is necessary for the column selection circuit 30, the selector line driving circuit 50 and the word line driving circuit 60 to perform their selection operations.

The selector line driving circuit 50 (the selector line selection circuit) is a circuit for selecting a selector line, from among a plurality of selector lines SEL, that is necessary for a read operation. These selector lines are used to control the conductivity state of selection transistors to be described later.

The word line driving circuit 60 (the word line selection circuit) is a circuit for selecting a word line to be read and a reference word line from among a plurality of word lines WL.

The bit line voltage supply circuit 21 is a circuit for generating a drain voltage of 1.1 V in a read operation and supplies the generated drain voltage to main bit lines that are connected to the drain of the memory cell being read and that of the reference cell.

Configuration of Memory Cell Array 10

Figure 2:
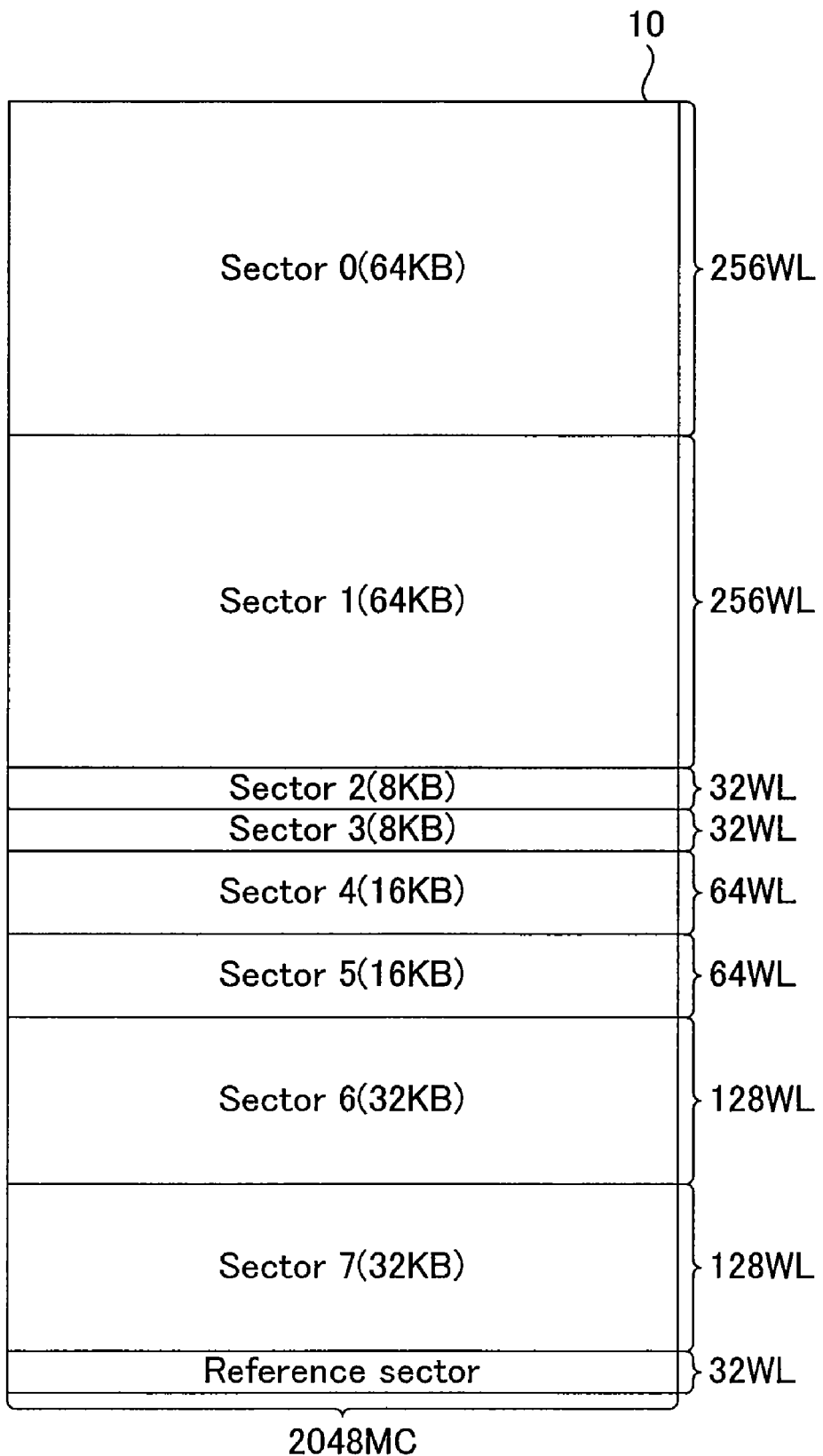
FIG. 2 is a block diagram showing a configuration of a memory cell array 10 of the semiconductor memory device according to Embodiment 1 of the present invention.

FIG. 2 is a block diagram showing a configuration of the memory cell array 10 of the semiconductor memory device according to Embodiment 1 of the present invention.

The memory cell array 10 includes eight sectors 0 to 7 and a reference sector including a reference cell for producing a reference voltage used in a read operation. Each sector includes a plurality of word lines. A word line is provided for each row of memory cells, and is connected to the gates (control terminals) of 2048 memory cells.

Referring to FIG. 2, the sectors 0 and 1 each include 256 word lines, the sector 2 and 3 each include 32 word lines, the sectors 4 and 5 each include 64 word lines, and the sectors 6 and 7 each include 128 word lines. Thus, the capacity of the sectors 0 and 1 is 64 KB, that of the sectors 2 and 3 is 8 KB, that of the sectors 4 and 5 is 16 KB, and that of the sectors 6 and 7 is 32 KB. The reference sector includes 32 word lines. While the reference sector includes 32 word lines, it is only one of the 32 word lines to which a voltage for reading the reference cell is applied in a read operation.

Figure 3:
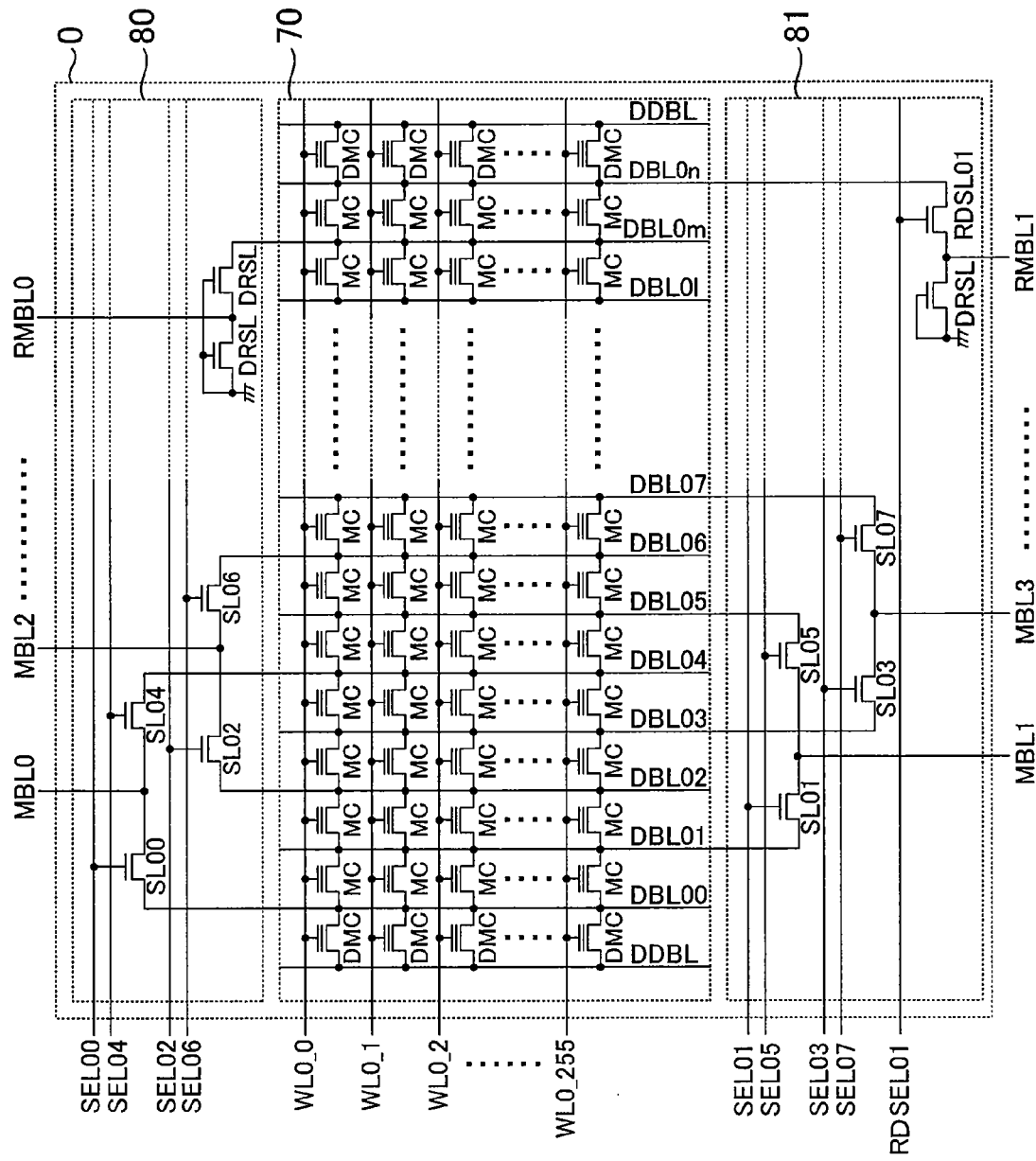
FIG. 3 is a circuit diagram showing a configuration of a sector 0 of the semiconductor memory device according to Embodiment 1 of the present invention.

FIG. 3 is a circuit diagram showing a configuration of a sector 0 of the semiconductor memory device according to Embodiment 1 of the present invention.

Referring to FIG. 3, the sector 0 includes a memory cell region 70 and selection transistor regions 80 and 81.

In the memory cell region 70, the sector 0 includes 256 word lines WL0_0 to WL0_255 and a plurality of sub-bit lines DBL00 to DBL0n. The outermost sub-bit lines provided along opposite sides of the memory cell region 70 are dummy sub-bit lines DDBL. The memory cell region 70 includes memory cells arranged in a virtual ground array (VGA) arrangement. Specifically, each memory cell MC is provided between a pair of sub-bit lines, with the source terminal and the drain terminal being connected to the pair of sub-bit lines. Provided along opposite sides of the memory cell region 70 are dummy memory cells DMC.

The semiconductor memory device of the present embodiment has a hierarchical bit line structure, where a plurality of main bit lines extend in the column direction, and a plurality of sub-bit lines extend in the column direction within each sector. In the selection transistor regions 80 and 81, the sector 0 includes selection transistors SL00 to SL07, etc., for controlling the connections between the sub-bit lines and the main bit lines.

For the purpose of illustration, FIG. 3 shows only the selection transistors SL00 to SL07 and the main bit lines MBL0 to MBL3, which will be discussed below. Note however that the sector 0 includes a number of other selection transistors and a number of other main bit lines similar in function to those shown in FIG. 3 according to the 2048 memory cells connected to the word lines.

Reference main bit lines RMBL0 and RMBL1 are main bit lines for carrying a reference voltage used in a read operation. The reference main bit line RMBL0 is connected to the drain of the reference cell to be described later, and the reference main bit line RMBL1 is connected to the source of the reference cell. The arrangement is such that a selection transistor RDSL01 can be used to connect the sub-bit line DBL0n of the sector 0 to the reference main bit line RMBL1 in order to match the capacitances of main bit lines. The connection between the reference main bit line RMBL1 and the sub-bit line DBL0n is controlled by a selector line RDSEL01, which is connected to the gate of the selection transistor RDSL01. Dummy selection transistors DRSL connected to the reference main bit lines RMBL0 and RMBL1 have their gates connected to the ground voltage, and are always inactive. Therefore, the sub-bit line DBL0m is never connected to the main bit line RMBL0. The dummy selection transistors DRSL are provided for making the diffusion parasitic capacitance of the selection transistor connected to the reference main bit line equal to the diffusion parasitic capacitance of the selection transistor connected to each of the main bit lines MBL0 to MBL4. Thus, in the sector 0, two selection transistor source-drain diffusions are connected to each of the main bit lines MBL0 to MBL4 to which memory cells are connected. Therefore, the dummy selection transistor DRSL is connected to each of the reference main bit lines RMBL0 and RMBL1. Then, the number of selection transistors connected to each of the reference main bit lines RMBL0 and RMBL1 is two, whereby the reference main bit lines RMBL0 and RMBL1 each have a selection transistor source-drain diffusion capacitance of a similar level to those of the main bit lines MBL0 to MBL4. Thus, in the semiconductor memory device of the present embodiment, the selection transistor diffusion capacitance of a main bit line to which memory cells are connected is matched with that of a reference main bit line.

While the configuration of the sector 0 has been described above, those of other sectors are substantially the same. Note however that the number of word lines provided in the memory cell region 70 of each sector varies depending on the capacity of the sector. The sector 0 includes 256 word lines, and other sectors include other numbers of word lines as shown in FIG. 2.

Figure 4:
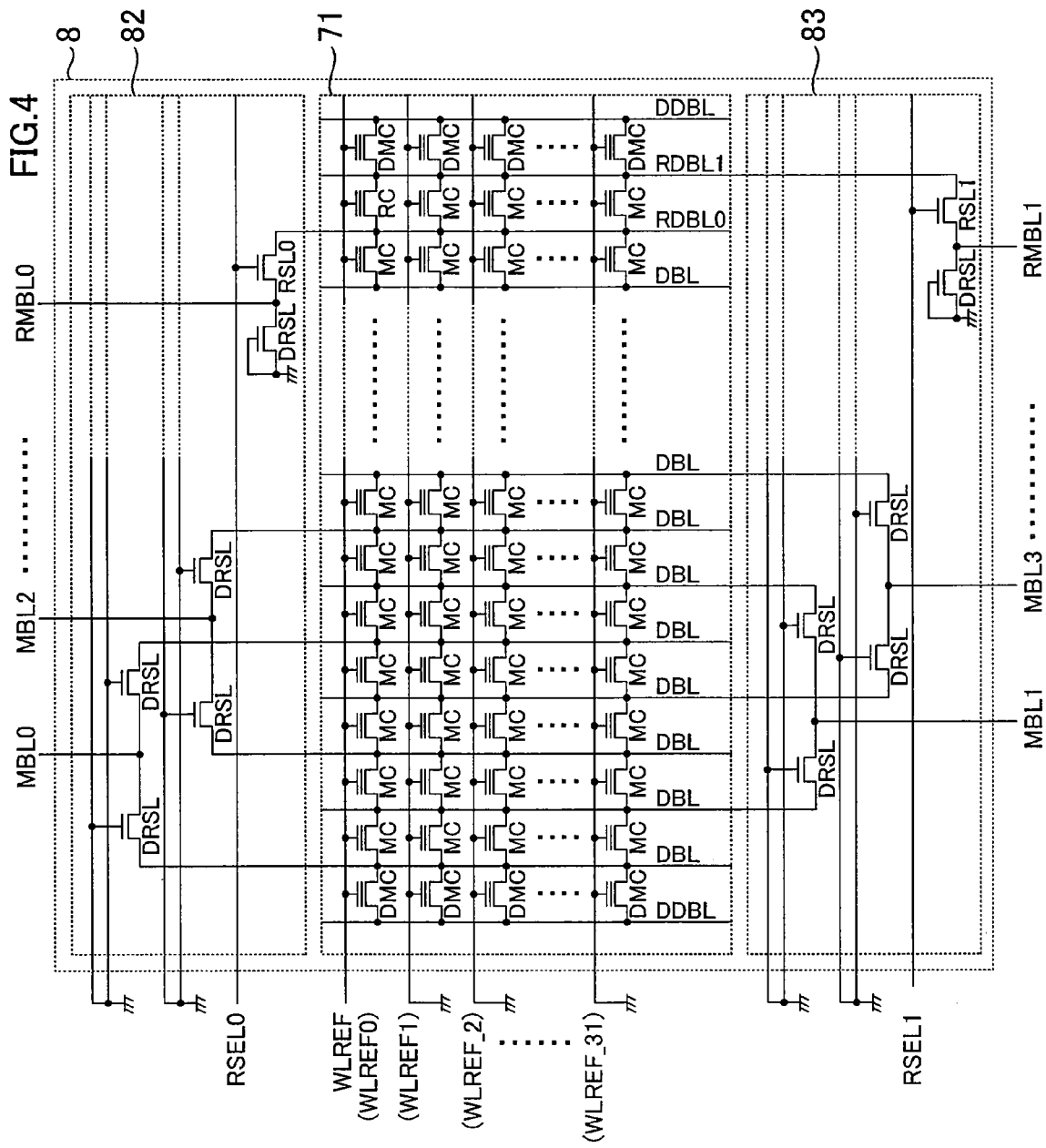
FIG. 4 is a circuit diagram showing a configuration of a reference sector 8 of the semiconductor memory device according to Embodiment 1 of the present invention.

FIG. 4 shows a configuration of a reference sector 8 of the semiconductor memory device according to Embodiment 1 of the present invention.

Referring to FIG. 4, the reference sector 8 includes a memory cell region 71, and selection transistor regions 82 and 83.

In the memory cell region 71, the reference sector 8 includes 32 word lines WLREF0 to WLREF31 and a plurality of sub-bit lines. The outermost sub-bit lines provided along opposite sides of the memory cell region 71 are dummy sub-bit lines DDBL. The memory cell region 71 includes memory cells arranged in a virtual ground array arrangement. Provided along opposite sides of the memory cell region 71 are dummy memory cells DMC.

A reference cell RC for producing the reference voltage used in a read operation has its source and drain connected to sub-bit lines RDBL0 and RDBL1, respectively, and its gate connected to a word line WLREF (WLREF0). The threshold voltage of the reference cell RC is set during the inspection of the semiconductor memory device such that an optimal amount of current for producing the reference voltage flows in a read operation. The reference cell RC is of the same type as the memory cells used in the sectors 0 to 7.

Word lines WLREF1 to WLREF31, other than the word line WLREF (WLREF0) to which the reference cell RC is connected, are always connected to the ground voltage, whereby all the memory cells connected to the word lines WLREF1 to WLREF31 are always inactive.

The selection transistor regions 82 and 83 include selection transistors for electrically controlling the connections between sub-bit lines and main bit lines. A selection transistor RSL0 controls the connection between the sub-bit line RDBL0 and the main bit line RMBL0, and the gate thereof is connected to a selector line RSEL0. A selection transistor RSL1 controls the connection between the sub-bit line RDBL1 and the main bit line RMBL1, and the gate thereof is connected to a selector line RSEL1. The dummy selection transistors DRSL connected to the reference main bit lines RMBL0 and RMBL1 have their gates connected to the ground voltage, and are always inactive. Two dummy selection transistors DRSL are connected also to each of the main bit lines MBL0 to MBL3, to which memory cells are connected. The dummy selection transistors DRSL have their gates connected to the ground voltage, and are always inactive. The dummy selection transistors DRSL are provided for making the diffusion parasitic capacitance of the selection transistor connected to the reference main bit line equal to the diffusion parasitic capacitance of the selection transistor connected to each of the main bit lines MBL0 to MBL4, to which memory cells are connected. Thus, in the reference sector 8, two selection transistor source-drain diffusions are connected to each of the main bit lines MBL0 to MBL4, to which memory cells are connected, and the reference main bit lines RMBL0 and RMBL1. Thus, in the semiconductor memory device of the present embodiment, the selection transistor diffusion capacitance of a main bit line to which memory cells are connected is matched with that of a reference main bit line.

Operation of Reading Out Data from Memory Cell of Sector 0

Figure 5:
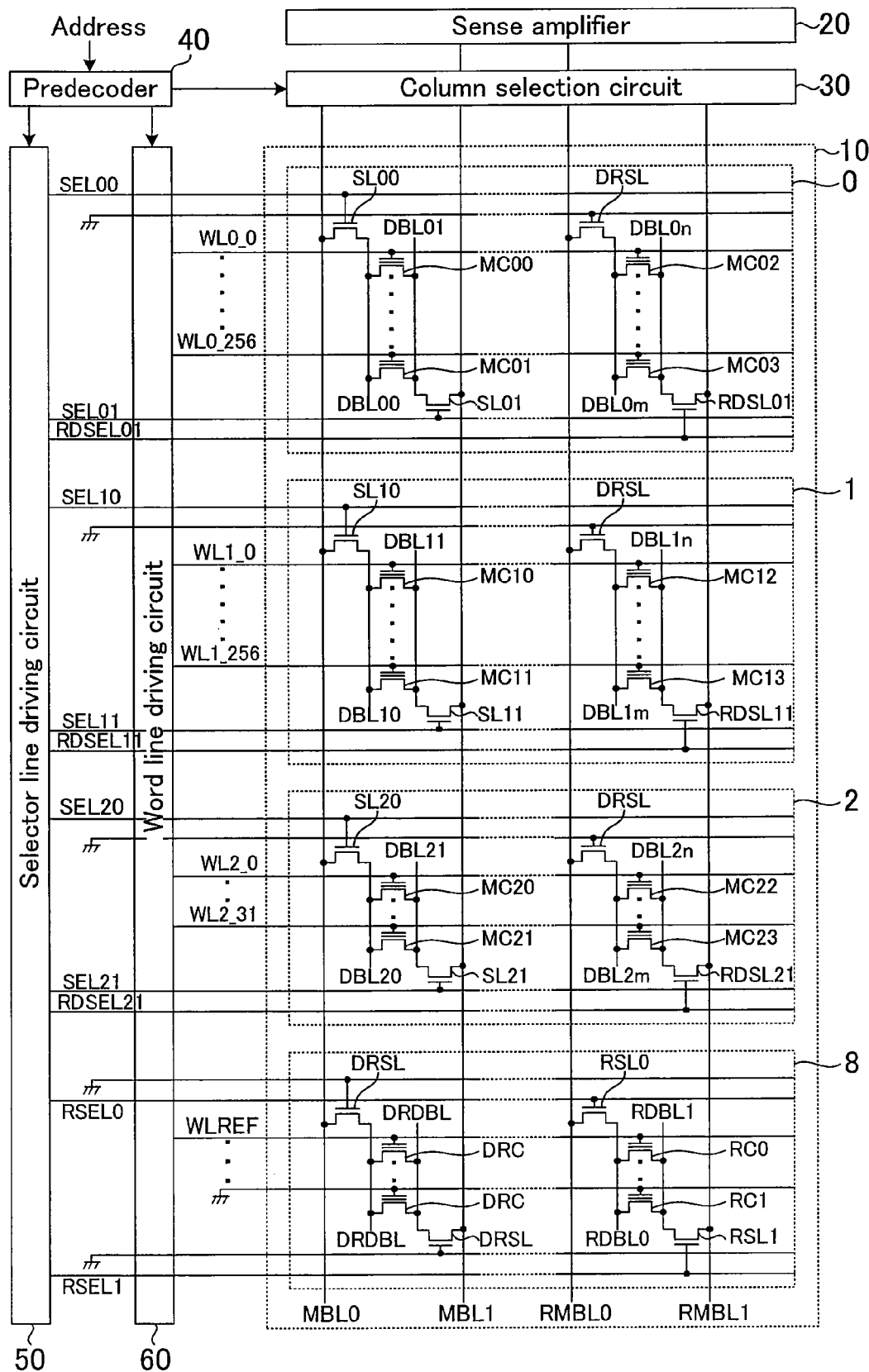
FIG. 5 is a block diagram showing a configuration of a portion of the semiconductor memory device according to Embodiment 1 of the present invention.

FIG. 5 is a block diagram showing a configuration of a portion of the semiconductor memory device according to Embodiment 1 of the present invention.

Figure 6:
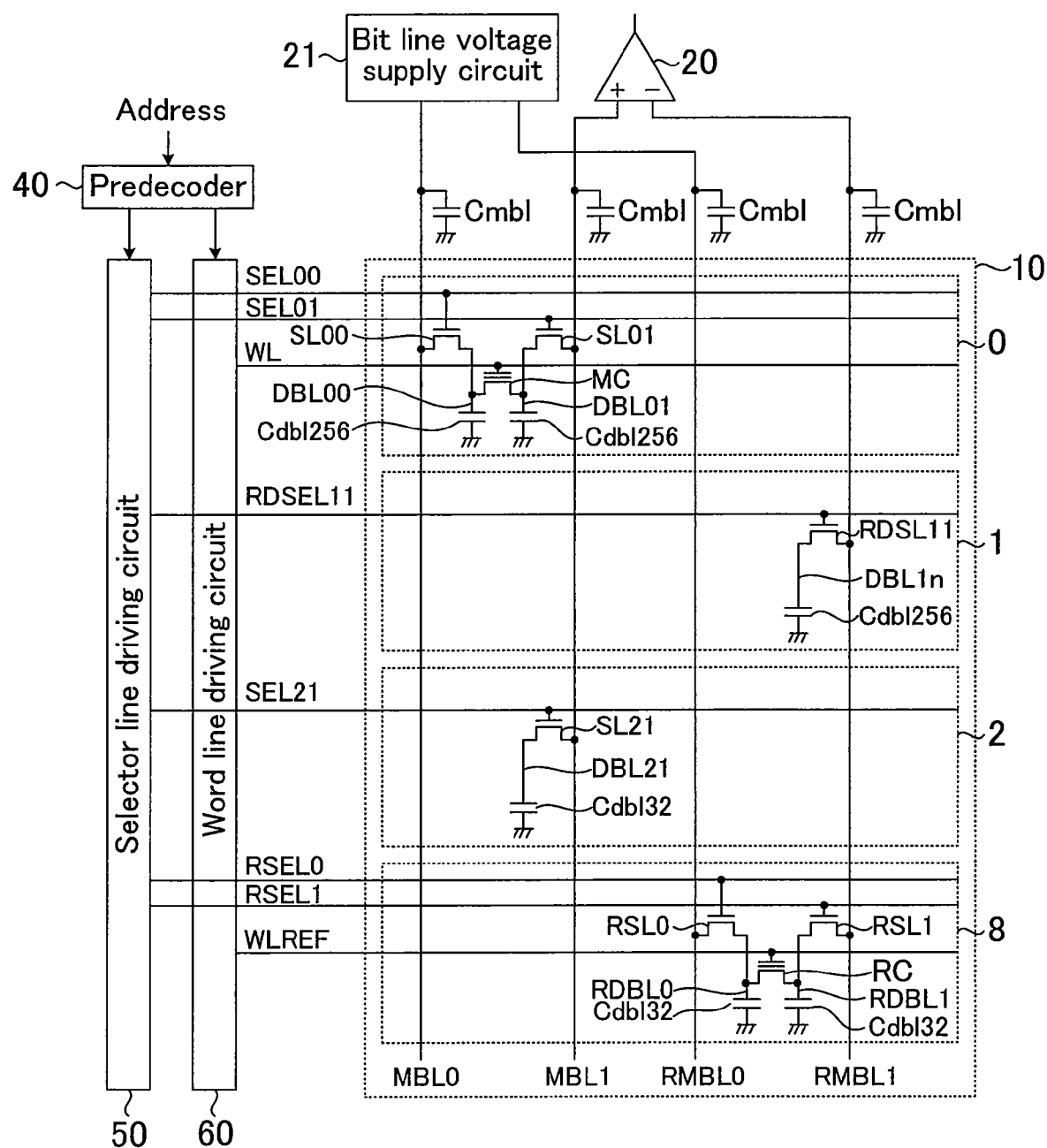
FIG. 6 is a diagram showing the parasitic capacitance of bit lines in a read operation of the semiconductor memory device according to Embodiment 1 of the present invention.

FIG. 6 is a diagram showing the parasitic capacitance of bit lines in a read operation of the semiconductor memory device according to Embodiment 1 of the present invention.

For the purpose of illustration, FIGS. 5 and 6 show only the main bit lines MBL0 and MBL1, to which memory cells to be read are connected, and the reference main bit lines RMBL0 and RMBL1, among other main bit lines of the semiconductor memory device described above. With respect to the memory cell array 10, only the sectors 0 to 2 and the reference sector 8 are shown. Also for the purpose of illustration, FIG. 6 shows only the memory cells connected to the word line WL and those connected to the word line WLREF, among other memory cells.

In FIG. 5, memory cells connected to the sub-bit lines DBL00 and DBL01 of the sector 0 are denoted as memory cells MC00 to MC01 (256 cells). Similarly, memory cells connected to the sub-bit lines DBL0$m$ and DBL0$n$ are denoted as memory cells MC02 to MC03 (256 cells).

A number of memory cells, corresponding to 256 word lines, are connected to the sub-bit lines DBL00, DBL01, DBL0$m$ and DBL0$n$. Since the memory cell array 10 is a virtual ground array, a total of 512 memory cells (256 memory cells shown in FIG. 5, and 256 adjacent memory cells not shown in FIG. 5) are connected to each of the sub-bit lines. Referring to FIG. 6, the parasitic capacitance for the 512 memory cells is denoted as Cdbl256.

The sectors 1 and 2 are substantially the same in configuration as the sector 0, as shown in FIG. 5, and will not be further described below. The sector 1 includes 256 word lines, and each of sub-bit lines DBL10, DBL11, DBL1$m$ and DBL1$n$ has a parasitic capacitance of Cdbl256, as in the sector 0. In contrast, the sector 2 includes 32 word lines, and a number of memory cells corresponding to the 32 word lines are connected to sub-bit lines DBL20, DBL21, DBL2$m$ and DBL2$n$. Specifically, since the memory cell array 10 is a virtual ground array, a total of 64 memory cells (32 memory cells shown in FIGS. 5 and 32 adjacent memory cells not shown in FIG. 5) are connected to each of the sub-bit lines. The parasitic capacitance for the 64 memory cells is denoted as Cdbl32. Therefore, the parasitic capacitance of a sub-bit line of the sector 2 is 1/8 of that of each sub-bit line of the sector 0 or 1.

The reference sector 8 will now be described with reference to FIG. 5. The main bit line MBL0 and the main bit line MBL1 are each connected to one of a plurality of dummy selection transistors DRSL. Each dummy selection transistor DRSL has its gate connected to the ground voltage, and is always inactive. Therefore, a sub-bit line DRDBL is never connected to the main bit line MBL0 or to the main bit line MBL1.

Thirty-two memory cells DRC are connected to each sub-bit line DRDBL, and a word line is connected to the gate of each memory cell DRC. Similarly, memory cells RC0 to RC1 (32 cells) are connected to the sub-bit lines RDBL0 and RDBL1, and a word line is connected to the gate of each memory cell. The memory cell RC0 is used as a reference cell for producing a reference voltage used in a read operation. The memory cell RC0 of FIG. 5 is the reference cell RC of FIG. 4. A number of memory cells corresponding to 32 word lines are connected to each of the sub-bit lines DRDBL, RDBL0 and RDBL1. Specifically, since the memory cell array 10 is a virtual ground array, a total of 64 memory cells (32 memory cells shown in FIGS. 5 and 32 adjacent memory cells not shown in FIG. 5) are connected to each of the sub-bit lines. The parasitic capacitance of each sub-bit line of the reference sector is the parasitic capacitance for 64 memory cells, as is the parasitic capacitance of a sub-bit line of the sector 2 having 32 word lines. Therefore, the parasitic capacitance of a sub-bit line of the reference sector is also denoted as Cdbl32.

In FIG. 6, Cmbl denotes a parasitic capacitance on a main bit line, and all the main bit lines MBL0, MBL1, RMBL0 and RMBL1 have substantially the same parasitic capacitance Cmbl. Cdbl256 and Cdbl32 each denote a parasitic capacitance of a sub-bit line. Specifically, Cdbl256 denotes the parasitic capacitance of each sub-bit line of the sectors 0 and 1, and Cdbl32 denotes the parasitic capacitance of each sub-bit line of the sector 2 and the reference sector 8. The relationship between the parasitic capacitance Cdbl256 and the parasitic capacitance Cdbl32 is Cdbl256=8×Cdbl32 (Cdbl256 is greater than Cdbl32).

The read operation of the semiconductor memory device having such a configuration will now be described for a case where data is read out from one of the memory cells MC00 to MC01 connected to the sub-bit lines DBL00 and DBL01 of the sector 0. Herein, the memory cell MC represents the memory cell from which data is read, from among the memory cells MC00 to MC01.

In order to read out data from the memory cell MC of the sector 0, the selector line driving circuit 50 selects selector lines RDSEL11 and SEL21, in addition to selector lines SEL00 and SEL01 and the selector lines RSEL0 and RSEL1.

When data is read out from the memory cell MC, the main bit line MBL0 is used as the drain terminal of the memory cell and the main bit line MBL1 is used as the source terminal thereof memory cell. Similarly, when data is read out from the reference cell RC, the reference main bit line RMBL0 is used as the drain terminal of the reference cell RC and the reference main bit line RMBL1 is used as the source terminal thereof. The bit line voltage supply circuit 21 supplies a data-reading drain voltage of 1.1 V to the main bit lines MBL0 and RMBL0 used as drain terminals. The main bit lines MBL1 and RMBL1 used as source terminals are connected to the sense amplifier 20. An example of a semiconductor memory device employing a source sensing method, where a sensing operation is performed with the source terminal being connected to the sense amplifier, will now be described.

FIG. 7 is a timing diagram showing a voltage waveform of a word line in a read operation of the semiconductor memory device according to Embodiment 1 of the present invention.

FIGS. 8A and 8B are timing diagrams each showing a voltage waveform of a selector line in a read operation of the semiconductor memory device according to Embodiment 1 of the present invention.

Figure 9:
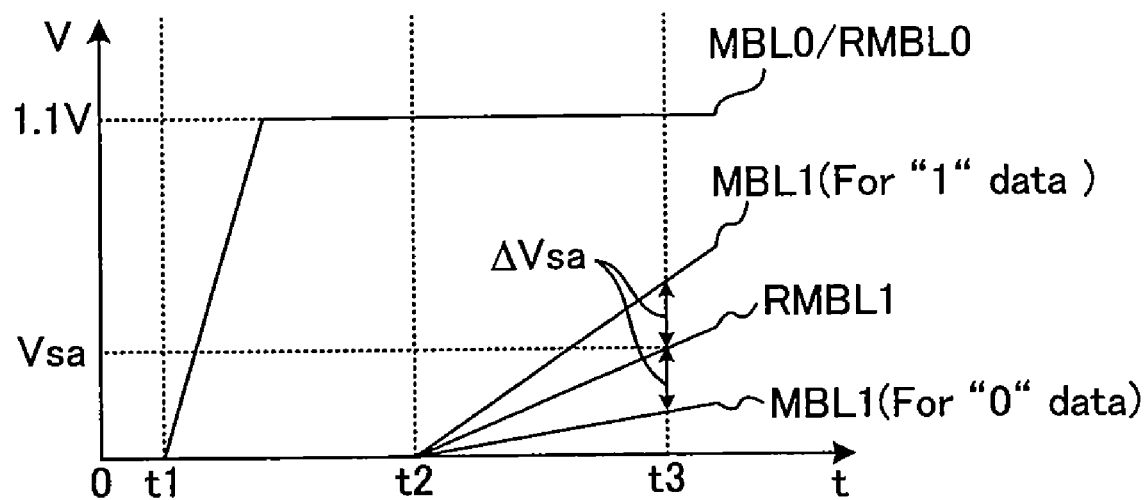
FIG. 9 is a timing diagram showing a voltage waveform of a main bit line in a read operation of the semiconductor memory device according to Embodiment 1 of the present invention.

FIG. 9 is a timing diagram showing a voltage waveform of a main bit line in a read operation of the semiconductor memory device according to Embodiment 1 of the present invention.

Referring to FIG. 7, a read operation starts at time t1. At time t1, in order to read out data from the memory cell MC of the sector 0, the word line WL, to which the gate of the memory cell MC is connected, and the reference word line WLREF, to which the gate of the reference cell RC is connected, are set to a data-reading word line voltage of 4.5 V by the word line driving circuit 60.

At the same time, the selector lines SEL00 and SEL01 of the sector 0, the selector lines RSEL0 and RSEL1 of the reference sector 8, a selector line SEL21 of the sector 2, and the selector line RDSEL11 of the sector 1 are set to a data-reading selector line voltage of 3 V by the selector line driving circuit 50, as shown in FIG. 8A.

When the selector line driving circuit 50 simultaneously drives a large number of selector lines in a read operation, as shown in FIG. 8A, there is a possibility that the power supply voltage fluctuates (IR-DROP). Specifically, power supply noise increases in a read operation, which may possibly lead to an erroneous read operation. In order to prevent this, the selector line driving circuit 50 may drive a plurality of selector lines over a plurality of points in time in a read operation by driving a subset of selector lines at a time, as shown in FIG. 8B. For example, the selector line driving circuit 50 may drive (select) a set of selector lines SEL00 and RSEL0 (i.e., a selector line that connects the drain of the memory cell to the main bit line, and a selector line that connects the drain of the reference cell to the main bit line) at time t1 (the start of the read operation), and then drive the remaining selector lines SEL01, SEL21, RSEL1 and RDSEL11 at time t1' (a predetermined amount of time after time t1). If the selector line driving circuit 50 drives a plurality of selector lines over a plurality of points in time in a read operation by driving a subset of selector lines at a time, the fluctuation of the power supply voltage when driving selector lines is reduced, thus reducing the power supply noise occurring in a read operation. Thus, the semiconductor memory device can accurately determine and read out data. If the selector line driving circuit 50 first selects the selector lines SEL00 and RSEL0 for bit lines to be precharged and then selects the remaining selector lines, it is possible to suppress the decrease in the reading speed due to a delay in the start of the precharge. Thus, it is possible to avoid a decrease in the reading speed and to reduce the power supply noise, whereby it is possible to accurately determine data.

Referring to FIG. 9, at time t1, the main bit line MBL0 connected to the drain terminal of the memory cell and the main bit line RMBL0 connected to the drain terminal of the reference cell are set (precharged) to 1.1 V by the bit line voltage supply circuit 21. Since the selector lines SEL00 and RSEL0 are selected, the sub-bit line DBL00, to which the memory cell is connected, and the sub-bit line RDBL0, to which the reference cell is connected, are brought to a data-reading drain voltage of 1.1 V. At this point in time, the main bit line MBL1 connected to the source terminal of the memory cell and the main bit line RMBL1 connected to the source terminal of the reference cell are fixed to the ground voltage.

As described above, the selector line driving circuit 50 selects the selector line SEL00 and the selector line SEL01 (i.e., sets these lines to the data-reading selector line voltage) in order to read out data from the memory cell MC of the sector 0. Thus, the sub-bit line DBL00, which is connected to the drain of the memory cell MC, is connected to the main bit line MBL0. Moreover, the sub-bit line DBL01, which is connected to the source of the memory cell MC, is connected to the main bit line MBL1.

The selector line driving circuit 50 further selects the selector line SEL21. Then, the sub-bit line DBL21 of the sector 2 (which is a different sector from the sector 0 including the memory cell being read, and which has the same size, i.e., the same number of word lines, as the reference sector 8) is connected to the main bit line MBL1, which is connected to the sense amplifier 20.

At this point in time, the total parasitic capacitance of the main bit line MBL0 is the sum of the parasitic capacitance Cmbl of the main bit line MBL0 and the parasitic capacitance Cdbl256 of the sub-bit line DBL00 of the sector 0 (i.e., Cmbl+Cdbl256). Similarly, the total parasitic capacitance of the main bit line MBL1 is the sum of the parasitic capacitance Cmbl of the main bit line, the parasitic capacitance Cdbl256 of the sub-bit line DBL01 of the sector 0, and the parasitic capacitance Cdbl32 of the sub-bit line DBL21 of the sector 2 (i.e., Cmbl+Cdbl256+Cdbl32).

On the other hand, the selector line driving circuit 50 selects the selector line RSEL0 and the selector line RSEL1 in order to obtain the reference voltage from the reference cell RC. Thus, the sub-bit line RDBL0, which is connected to the drain of the reference cell RC, is connected to the main bit line RMBL0. Moreover, the sub-bit line RDBL1, which is connected to the source of the reference cell RC, is connected to the main bit line RMBL1.

The selector line driving circuit 50 further selects the selector line RDSEL11. Then, the sub-bit line DBL1n of the sector 1 (which is a different sector from the sector 0 including the memory cell being read, and which has the same size, i.e., the same number of word lines, as the sector including the memory cell) is connected to the main bit line RMBL1, which is connected to the sense amplifier 20.

At this point in time, the total parasitic capacitance of the main bit line RMBL0 is the sum of the parasitic capacitance Cmbl of the main bit line RMBL0 and the parasitic capacitance Cdbl32 of the sub-bit line RDBL0 of the reference sector 8 (i.e., Cmbl+Cdbl32). Similarly, the total parasitic capacitance of the main bit line RMBL1 is the sum of the parasitic capacitance Cmbl of the main bit line RMBL1, the parasitic capacitance Cdbl32 of the sub-bit line RDBL1 of the reference sector 8, and the parasitic capacitance Cdbl256 of the sub-bit line DBL1n of the sector 1 (i.e., Cmbl+Cdbl32+Cdbl256). The main bit lines MBL1 and RMBL1, which are connected to the sense amplifier 20, have the same total parasitic capacitance, i.e., Cmbl+Cdbl256+Cdbl32.

At time t2 (after the word line voltage and the selector line voltage have reached predetermined values), a data-reading sensing operation is performed. Specifically, the fixing of MBL1 and RMBL1 (which are main bit lines serving as source terminals) is released at time t2, as shown in FIG. 9. The main bit lines MBL1 and RMBL1, serving as source terminals, are charged by currents flowing through the memory cell and the reference cell, and the voltages thereof increase. It is assumed herein that the memory cell represents "1" when the threshold voltage thereof is low and "0" when it is high. Referring to FIG. 9, if the memory cell represents "1", a large current flows through the memory cell, whereby the voltage of the main bit line MBL1 increases rapidly. If the memory cell represents "0", substantially no current flows through the memory cell, whereby the voltage of the main bit line MBL1 does not increase substantially.

The threshold voltage of the reference cell is set to an intermediate value between the threshold voltage of a memory cell representing "1" and that of a memory cell representing "0". Therefore, the voltage of the reference main bit line RMBL1 increases to be an intermediate value between the voltage of the main bit line MBL1 where the memory cell represent "1" and that where the memory cell represent "0", as shown in FIG. 9.

At time t3 (a predetermined amount of time after time t2), the potential difference between the main bit line MBL1, to which the memory cell is connected, and the reference main bit line RMBL1 is ΔVsa as shown in FIG. 9. The potential difference is amplified by the sense amplifier 20, and if the potential of the main bit line MBL1 is higher than that of the reference main bit line RMBL1, it is determined that data represented by the memory cell is "1". If the potential of the main bit line MBL1 is lower than that of the reference main bit line RMBL1, it is determined that data represented by the memory cell is "0".

Herein, an important factor is the total parasitic capacitance of the main bit line MBL1 connected to the sense amplifier and that of the reference main bit line RMBL1 in a sensing operation starting at time t2. The threshold voltage of the reference cell is set to an intermediately value between the threshold voltage of a memory cell representing "1" and that of a memory cell representing "0". If the total parasitic capacitance of the main bit line MBL1 is totally the same as that of the reference main bit line RMBL1, the potential of the reference main bit line RMBL1 in a sensing operation is exactly the intermediate value between the potential of the main bit line MBL1 when the memory cell represents "1" and that when the memory cell represents "0". Such a potential of the reference main bit line RMBL1 is an optimal reference voltage for reading out data being "1" and data being "0". On the other hand, if the total parasitic capacitance of the main bit line MBL1 and that of the reference main bit line RMBL1 differ from each other, the potential of the reference main bit line RMBL1 will not be such an optimal reference voltage. Then, the read operation margin decreases, and it is less likely that data is read accurately.

An example where the total parasitic capacitance of the main bit line MBL1 differs from that of the reference main bit line RMBL1 will be described in detail. In the present embodiment, the sub-bit line DBL1$n$ of the sector 1 is connected to the reference main bit line RMBL1 in order to match the parasitic capacitances. Where the sub-bit line DBL1$n$ of the sector 1 is not connected to the reference main bit line RMBL1, the total parasitic capacitance of the main bit line MBL1 is Cmbl+Cdbl256+Cdbl32, whereas the total parasitic capacitance of the reference main bit line RMBL1 is Cmbl+Cdbl32. Thus, the total parasitic capacitance (Cmbl+Cdbl32) of the reference main bit line RMBL1 in a read operation is smaller than the total parasitic capacitance (Cmbl+Cdbl256+Cdbl32) of the reference main bit line RMBL1 of the present embodiment. Therefore, the potential of the reference main bit line RMBL1 in a sensing operation is higher than the potential shown in FIG. 9. Thus, where a memory cell representing "1" is read, the potential difference ΔVsa between the main bit line MBL1 and the reference main bit line RMBL1 decreases, and the read operation margin decreases. With the semiconductor memory device of the present embodiment, the total parasitic capacitance of the main bit line MBL1 is matched with that of the reference main bit line RMBL1, whereby the read operation margin will not decrease due to the total parasitic capacitances being different from each other.

As described above, the selector line driving circuit 50 selects selector lines so that a sub-bit line of the sector 2 having the same size as that of the reference sector 8 is connected to the main bit line MBL1, and a sub-bit line of the sector 1 having the same size as that of the sector 0 including the memory cell being read is connected to the main bit line RMBL1. Thus, the total parasitic capacitances of the main bit lines MBL1 and RMBL1 of the memory cell connected to the sense amplifier 20 and the reference cell are equal to each other. In such a semiconductor memory device where the parasitic capacitance of a bit line connected to the memory cell and that of a bit line connected to the reference cell in a read operation are matched with each other, data is determined accurately.

When data is read out from a memory cell in the memory cell array 10 being virtual ground array, a pair of main bit lines connected to the drain and the source of the memory cell being read and a pair of main bit lines connected to the drain and the source of the reference cell are selected. With the conventional semiconductor memory device (FIGS. 3 and 4 of Japanese Laid-Open Patent Publication No. 2005-228446), in a read operation, the total parasitic capacitance of the main bit line connected to the drain of the reference cell and that of the main bit line connected to the drain of the memory cell are matched with each other, and the total parasitic capacitance of the main bit line connected to the source of the reference cell and that of the main bit line connected to the source of the memory cell are matched with each other. In the conventional semiconductor memory device, the selector line selection circuit drives (selects), in a read operation, selector lines for connecting a main bit line on the drain side of the reference cell and another main bit line on the source side of the reference cell to respective sub-bit lines for adjusting the capacitances of the main bit lines. In contrast, with the semiconductor memory device of the present embodiment, only the total parasitic capacitance of the main bit line MBL1 on the source side of the memory cell connected to the sense amplifier 20 is matched with that of the main bit line RMBL1 on the source side of the reference cell. Accordingly, the selector line driving circuit 50 drives (selects) selector lines for connecting main bit lines on the source side of the memory cell connected to the sense amplifier and on the source side of the reference cell to sub-bit lines for adjusting the total parasitic capacitances of the main bit lines. Thus, with the semiconductor memory device of the present embodiment, the number of selector lines to be driven can be reduced as compared with a case where the total parasitic capacitance matching is achieved between a main bit line on the drain side of the reference cell and that on the drain side of the memory cell and between a main bit line on the source side of the reference cell and that on the source side of the memory cell. As a fewer number of selector lines are driven, the power consumption in a read operation is reduced.

Moreover, with the semiconductor memory device of the present embodiment, a sub-bit line of a sector different from the sector being read is connected to the main bit line for adjusting the main bit line capacitance, in addition to the sub-bit line connected to the memory cell being read. Therefore, it is not necessary to separately provide capacitor elements, or the like, in the semiconductor memory device for adjusting the main bit line capacitance, whereby the total area and the cost of the semiconductor memory device are reduced as compared with a case where capacitor elements are provided separately.

Detailed Configuration Of Selector Line Driving Circuit 50

The selector line driving circuit 50 is configured so as to select selector lines so that main bit lines and sub-bit lines are connected to each other as follows.

Referring to FIG. 10, which main bit lines are connected to which sub-bit lines when data are read out from memory cells of different sectors will be described.

FIG. 10 is a diagram showing a sector to which a sub-bit line connected to a main bit line belongs in a read operation of the semiconductor memory device according to Embodiment 1 of the present invention. More specifically, FIG. 10 shows the sector of each of sub-bit lines connected respectively to the main bit line, to which the drain of the memory cell being read is connected, the main bit line (sensing node), to which the source of the memory cell being read is connected, the main bit line, to which the drain of the reference cell is connected, and the main bit line (sensing node), to which the source of the reference cell is connected.

In the description below, the main bit line to which the drain of the memory cell being read is connected is referred to as the drain main bit line of the memory cell. Moreover, the main bit line to which the source of the memory cell being read is referred to as the source main bit line of the memory cell. Similarly, the main bit line to which the drain of the reference cell is connected is referred to as the drain main bit line of the reference cell, and the main bit line to which the source of the reference cell is connected is referred to as the source main bit line of the reference cell.

Referring to FIG. 10, when data is read out from a memory cell of the sector 0, the drain main bit line of the memory cell is connected to a sub-bit line that is connected to the memory cell being read, i.e., a sub-bit line of the sector 0. Moreover, the source main bit line of the memory cell is connected to a sub-bit line of the sector 0 including the memory cell being read, and also to a sub-bit line of the sector 2 for adjusting the bit line capacitance. Similarly, the drain main bit line of the reference cell is connected to a sub-bit line of the reference sector including the reference cell. The source main bit line of the reference cell is connected to a sub-bit line of the reference sector, and also to a sub-bit line of the sector 1 for adjusting the bit line capacitance. When main bit lines and sub-bit lines are connected to each other as described above, the sectors including the sub-bit lines connected to the source main bit line of the memory cell and the source main bit line of the reference cell have the same total capacitance value (64 KB+8 KB). In other words, the total number of memory cells connected to sub-bit lines that are connected to the source main bit line of the memory cell is equal to the total number of memory cells connected to sub-bit lines that are connected to the source main bit line of the reference cell. Therefore, the source main bit line of the memory cell and that of the reference cell have the same total parasitic capacitance.

With the semiconductor memory device of the present invention, when data is read out from the sector 0, a sub-bit line of the sector 2, which has the same capacitance as the reference sector, is connected to the source main bit line of the memory cell, in addition to a sub-bit line of the sector 0 including the memory cell being read. Similarly, a sub-bit line of the sector 1, which has the same capacitance as the sector 0 including the memory cell being read, is connected to the source main bit line of the reference cell, in addition to a sub-bit line of the reference sector. Thus, the total parasitic capacitance of the source main bit line of the memory cell is equal to that of the source main bit line of the reference cell.

Similarly, when data is read out from a memory cell of the sector 1, a sub-bit line of the sector 1 including the memory cell being read is connected to the drain main bit line of the memory cell. A sub-bit line of the sector 1 including the memory cell being read is connected to the source main bit line of the memory cell, and also a sub-bit line of the sector 2 is connected thereto for adjusting the bit line capacitance. Similarly, a sub-bit line of the reference sector including the reference cell is connected to the drain main bit line of the reference cell. A sub-bit line of the reference sector is connected to the source main bit line of the reference cell, and also a sub-bit line of the sector 0 is connected thereto for adjusting the bit line capacitance. When main bit lines and sub-bit lines are connected to each other as described above, the sectors including the sub-bit lines connected to the source main bit line of the memory cell and the source main bit line of the reference cell have the same total capacitance value (64 KB+8 KB). In other words, the total number of memory cells connected to sub-bit lines that are connected to the source main bit line of the memory cell is equal to the total number of memory cells connected to sub-bit lines that are connected to the source main bit line of the reference cell. Therefore, the source main bit line of the memory cell and that of the reference cell have the same total parasitic capacitance.

When data is read out from a memory cell of the sector 2, a sub-bit line of the sector 2 including the memory cell being read is connected to the drain main bit line of the memory cell. A sub-bit line of the sector 2 including the memory cell being read is connected to the source main bit line of the memory cell, and also a sub-bit line of the sector 3 is connected thereto for adjusting the bit line capacitance. Similarly, a sub-bit line of the reference sector including the reference cell is connected to the drain main bit line of the reference cell. A sub-bit line of the reference sector is connected to the source main bit line of the reference cell, and also a sub-bit line of the sector 3 is connected thereto for adjusting the bit line capacitance. When main bit lines and sub-bit lines are connected to each other as described above, the sectors including the sub-bit lines connected to the source main bit line of the memory cell and the source main bit line of the reference cell have the same capacitance value (8 KB+8 KB). In other words, the total number of memory cells connected to sub-bit lines that are connected to the source main bit line of the memory cell is equal to the total number of memory cells connected to sub-bit lines that are connected to the source main bit line of the reference cell. Therefore, the source main bit line of the memory cell and that of the reference cell have the same total parasitic capacitance.

The sectors 3 to 7 are similar to the sectors 0 to 2, and will not be further described below.

When data is read out from a memory cell, the selector line driving circuit 50 of the present embodiment selects a pair of selector lines for connecting a first pair of main bit lines with a pair of sub-bit lines, to which the memory cell being read is connected, a selector line for connecting one of the first pair of main bit lines that is connected to the sense amplifier 20 with a sub-bit line of a second sector being different from a first sector including the memory cell being read, a pair of selector lines for connecting a second pair of main bit lines with a pair of sub-bit lines to which the reference cell is connected, and a selector line for connecting one of the second pair of main bit lines that is connected to the sense amplifier 20 with a sub-bit line of a third sector being different from the first sector and the second sector. Therefore, the selector line driving circuit 50 can completely match the capacitances of the two main bit lines connected to the sense amplifier by selecting as the second sector a sector having the same size as that of the reference sector and selecting as the third sector a sector having the same size as that of the first sector. Thus, data can be determined accurately.

In the present embodiment, in order to completely match the capacitance of the main bit line connected to the memory cell with that of the main bit line connected to the reference cell, a sub-bit line of a sector having the same size as that of the reference sector is connected to the main bit line connected to the memory cell being read, and a sub-bit line of a sector having the same size as that of a sector including the memory cell being read is connected to the main bit line connected to the reference cell. In order for the semiconductor memory device to perform such an operation, there need to be at least two sectors having the same capacitance (size) in the memory cell array.

Moreover, with the semiconductor memory device of the present embodiment, a sub-bit line for adjusting the parasitic capacitance is connected only to a main bit line that is connected to the sense amplifier in a read operation. Therefore, as compared with a case where a sub-bit line for adjusting the parasitic capacitance is connected to all the main bit lines connected to the memory cell being read or the reference cell, it is possible to reduce the number of selector lines to be driven and to reduce the power consumption in a read operation.

Embodiment 2

A semiconductor memory device according to Embodiment 2 of the present invention differs from the semiconductor memory device of Embodiment 1 with respect to the configuration of the selector line driving circuit 50. Otherwise, the configuration of the semiconductor memory device and the resultant effects are similar to those of the semiconductor memory device of Embodiment 1.

The selector line driving circuit 50 of the present embodiment selects selector lines so that main bit lines and sub-bit lines are connected to each other as follows.

FIG. 11 is a diagram showing a sector to which a sub-bit line connected to a main bit line belongs in a read operation of the semiconductor memory device according to Embodiment 2 of the present invention.

First, a case where data is read out from a memory cell of the sector 4 will be described with reference to FIG. 11. The drain main bit line of the memory cell is connected to a sub-bit line, to which the memory cell being read is connected, i.e., a sub-bit line of the sector 4. The source main bit line of the memory cell is connected to a sub-bit line of the sector 4 including the memory cell being read, and also to a plurality of sub-bit lines of the sector 5, the sector 6 and the sector 2 for adjusting the bit line capacitance. Similarly, the drain main bit line of the reference cell is connected to a sub-bit line of the reference sector including the reference cell. The source main bit line of the reference cell is connected to a sub-bit line of the reference sector, and also to a sub-bit line of the sector 1 for adjusting the bit line capacitance. When main bit lines and sub-bit lines are connected to each other as described above, the sectors including the sub-bit lines connected to the source main bit line of the memory cell and the source main bit line of the reference cell have the same capacitance value (a total of 72 KB). The total number of memory cells connected to sub-bit lines that are connected to the source main bit line of the memory cell is equal to the total number of memory cells connected to sub-bit lines that are connected to the source main bit line of the reference cell. Therefore, the source main bit line of the memory cell and that of the reference cell have the same total parasitic capacitance.

Similarly, when data is read out from a memory cell of the sector 5, sub-bit lines of four sectors are connected to the source main bit line of the memory cell. When data is read out from a memory cell of the sector 6 or 7, sub-bit lines of three sectors are connected to the source main bit line of the memory cell. When data is read out from a memory cell of the sectors 0 to 3, sub-bit lines of two sectors are connected to the source main bit line of the memory cell, as in Embodiment 1. However, when data is read out from a memory cell of the sector 2 or 3, the type of the sub-bit line connected to the source main bit line of the memory cell and that connected to the source main bit line of the reference cell are different from those of Embodiment 1. A case where data is read out from a memory cell of the sector 2 will now be described in detail. With the semiconductor memory device of Embodiment 1, a sub-bit line of the sector 3 is connected to the source main bit line of the memory cell, in addition to a sub-bit line of the sector 2 including the memory cell being read. With the semiconductor memory device of Embodiment 2, a sub-bit line of the sector 0 is connected to the source main bit line of the memory cell, in addition to a sub-bit line of the sector 2 including the memory cell being read. Similarly, the sub-bit line connected to the source main bit line of the reference cell when data is read out from a memory cell of the sector 2 or 3 in Embodiment 1 also differs from that in Embodiment 2.

Referring to FIG. 10, with the semiconductor memory device of Embodiment 1, when data is read out from a memory cell in any sector, the source main bit line of the memory cell and the source main bit line of the reference cell have the same total parasitic capacitance. However, the total parasitic capacitance of the main bit line in a read operation varies depending on the sector to which the memory cell being read belongs. The total parasitic capacitance of the main bit line when data is read out from a memory cell of a sector will be described in detail for each sector. When data is read out from a memory cell of the sector 0 or 1, the sum of the capacitances of the sectors, to which sub-bit lines connected to each of source main bit lines belong, is 72 KB (64 KB+8 KB). In contrast, when data is read out from a memory cell of the sector 2 or 3, the sum of the capacitances of the sectors, to which sub-bit lines connected to each of source main bit lines belong, is 16 KB (8 KB+8 KB). When data is read out from a memory cell of the sector 4 or 5, the sum of the capacitances of the sectors, to which sub-bit lines connected to each of source main bit lines belong, is 24 KB (16 KB+8 KB). When data is read out from a memory cell of the sector 6 or 7, sum of the capacitances of the sectors, to which sub-bit lines connected to each of source main bit lines belong, is 40 KB (32 KB+8 KB). Thus, the total parasitic capacitance of the source main bit line varies depending on the sector to which the memory cell being read belongs. Accordingly, if a memory cell being read belongs to a different sector, the voltage on the source main bit line used at time t3 in FIG. 9 (when readout data is determined by the sense amplifier) varies even though the same current flows through the memory cell in a read operation. When the voltage on the source main bit line varies, the point of operation of the sense amplifier also varies, whereby the data-reading characteristics may vary.

With the semiconductor memory device of Embodiment 2, the total parasitic capacitance of the source main bit line of the memory cell and that of the source main bit line of the reference cell are completely matched with each other, irrespective of from which sector data is read out, as shown in FIG. 11. This is similar to the semiconductor memory device of Embodiment 1. With the semiconductor memory device of Embodiment 2, the total capacitance of the sub-bit lines connected to each source main bit line is 72 KB, irrespective of from which sector data is read out. In other words, the total parasitic capacitance of each source main bit line (the sum of the parasitic capacitance on the main bit line and that on the sub-bit line connected thereto) is the same, irrespective of from which sector data is read out. Thus, if the same current flows through the memory cell in a read operation even though the sector to which the memory cell being read belongs differs, the same voltage will be on each source main bit line used at time t3 in FIG. 9 (when readout data is determined by the sense amplifier). Thus, the point of operation of the sense amplifier will be the same, irrespective of from which sector data is read out, whereby it is possible to reduce the variations in the data-reading characteristics and to accurately determine data.

In the present embodiment, the selector line driving circuit 50 can select selector lines so that three or more sub-bit lines are connected to a source main bit line. Therefore, the selector line driving circuit 50 can select selector lines so that the total parasitic capacitance of the source main bit line of the memory cell and the source main bit line of the reference cell is the same, irrespective of from which sector data is read out.

In the present embodiment, a plurality of sub-bit lines of a sector other than the sector including the memory cell being read are connected only to the source main bit line of the memory cell. Note however that a plurality of sub-bit lines of a sector other than the sector including the memory cell being read may be connected to the source main bit line of the reference cell, depending on the sector configuration of the memory cell array.

When data is read out from a memory cell, the selector line driving circuit 50 of the present embodiment selects a pair of selector lines for connecting a first pair of main bit lines with a pair of sub-bit lines, to which the memory cell being read is connected, a selector line for connecting one of the first pair of main bit lines that is connected to the sense amplifier 20 with a sub-bit line of at least one sector different from the first sector, to which the memory cell belongs, a pair of selector lines for connecting a second pair of main bit lines with a pair of sub-bit lines, to which the reference cell is connected, and a selector line for connecting one of the second pair of main bit lines that is connected to the sense amplifier 20 with a sub-bit line of at least one sector different from the first sector. Therefore, the selector line driving circuit 50 can completely match the capacitances of the two main bit lines connected to the sense amplifier. Thus, data can be determined accurately.

Embodiment 3

First, the "neighbor effect" occurring in a memory cell array being a virtual ground array will be described.

In a memory cell array being a virtual ground array, a sub-bit line to which a memory cell being read is connected is also connected to an adjacent memory cell, which shares a word line with the memory cell being read. Therefore, when a word line connected to the memory cell being read is selected so as to read out data from the memory cell being read, the adjacent memory cell is also activated. Then, there is a current flow or no current flow through the adjacent memory cell, depending on whether the adjacent memory cell represents "1" (the threshold voltage of the memory cell is low) or "0" (the threshold voltage of the memory cell is high). Specifically, if the adjacent memory cell represents "1", there is a current flow through the adjacent memory cell. If the adjacent memory cell represents "0", there is substantially no current flow through the adjacent memory cell. Where the adjacent memory cell represents "1", a portion of the current flowing into the memory cell being read flows into the adjacent memory cell, whereby the effective current flowing through the memory cell being read appears smaller. This is called the "neighbor effect". The neighbor effect also occurs for a reference cell, if a memory cell in a memory cell array being a virtual ground array is used as a reference cell.

Even if the capacitance of the source main bit line of the memory cell and that of the source main bit line of the reference cell are completely matched with each other, the voltage when sensing the main bit line connected to the sense amplifier varies depending on the data represented by an adjacent memory cell, if there is a current flow or no current flow through the adjacent memory cell depending on the data represented by the adjacent memory cell. Thus, data cannot be determined accurately.

The semiconductor memory device of the present embodiment differs from the semiconductor memory device of Embodiment 1 in that the semiconductor memory device of the present embodiment includes a neighbor effect cancellation circuit 22 for reducing the "neighbor effect". The configuration of the selector line driving circuit 50 also differs from that of the semiconductor memory device of Embodiment 1.

Figure 12:
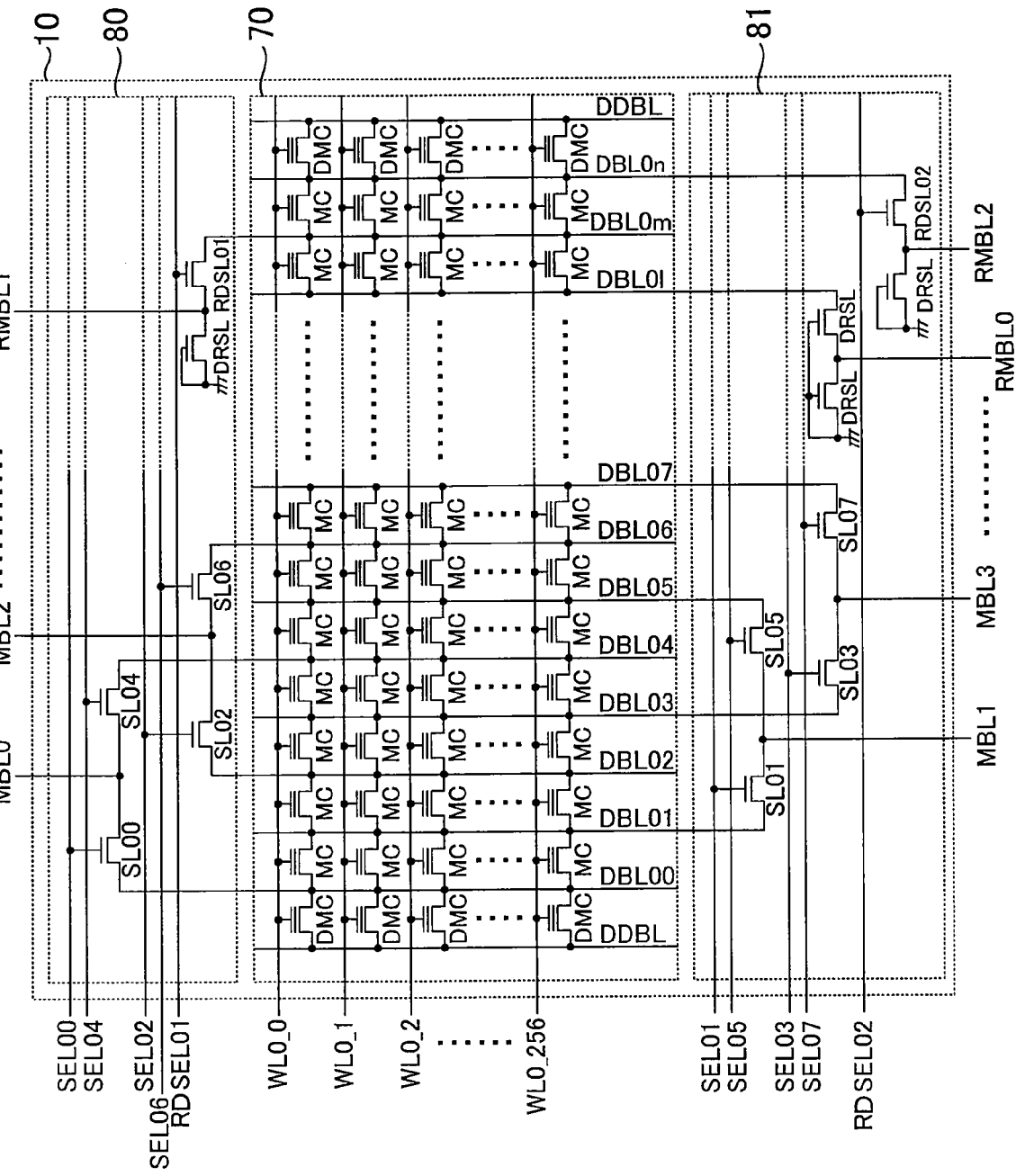
FIG. 12 is a circuit diagram showing a configuration of the sector 0 of semiconductor memory devices according to Embodiments 3 and 4 of the present invention.
Figure 13:
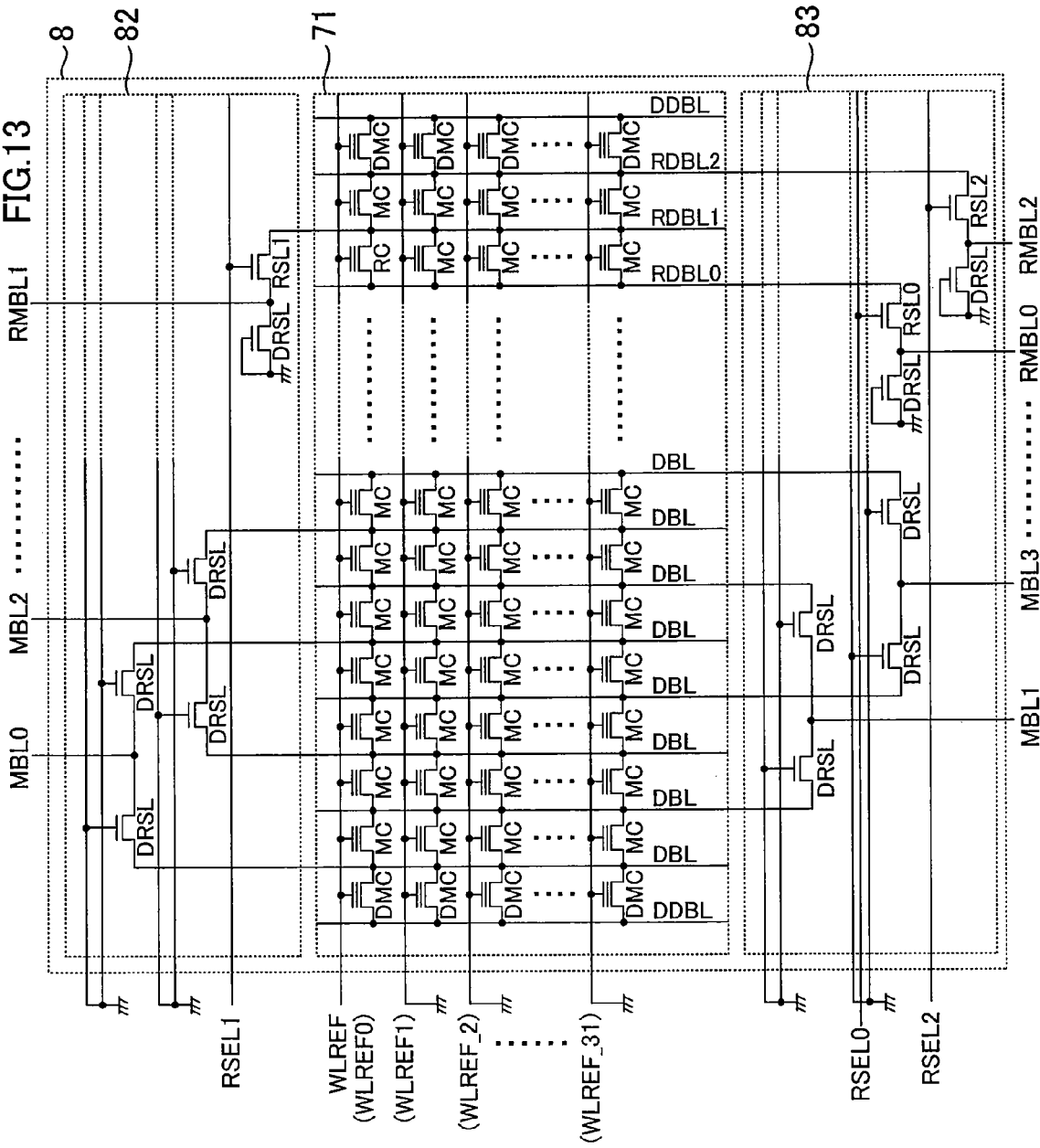
FIG. 13 is a circuit diagram showing a configuration of the reference sector 8 of the semiconductor memory devices according to Embodiments 3 and 4 of the present invention.

The configuration of the memory cell array 10 also differs from that of the semiconductor memory device of Embodiment 1. The number of word lines and the capacitance of each sector are the same as those of Embodiment 1, but the positions of the reference cells are different from those of Embodiment 1. FIG. 12 shows the configuration of the sector 0 of the present embodiment. The configuration of the reference sector of the present embodiment is shown in FIG. 13.

While FIG. 12 shows the configuration of the sector 0, the other sectors have substantially the same configuration. Note however that the number of word lines provided in the memory cell region 70 of each sector varies depending on the capacity of the sector. The sector 0 includes 256 word lines, and other sectors include other numbers of word lines as shown in FIG. 2.

The selector line driving circuit 50 selects selector lines that are selected by the selector line driving circuit 50 of Embodiment 1 in a read operation, and also selects selector lines so that a sub-bit line that is connected to an adjacent memory cell to the memory cell being read and that is not connected to the memory cell being read is connected to the corresponding main bit line. Such a selection of selector lines is done no matter which memory cell is read.

The neighbor effect cancellation circuit 22 produces a current flow, in a read operation, through the corresponding main bit line (i.e., the main bit line connected to an adjacent memory cell to the memory cell being read) so that the potential thereof is brought closer to that of a main bit line that is connected both to the adjacent memory cell and to the memory cell being read. The neighbor effect cancellation circuit 22 also produces a current flow, in a read operation, the main bit line connected to an adjacent memory cell to the reference cell so that the potential thereof is brought closer to a main bit line that is connected both to the adjacent memory cell and to the reference cell. The neighbor effect cancellation circuit 22 may be, for example, a constant current source.

Figure 14:
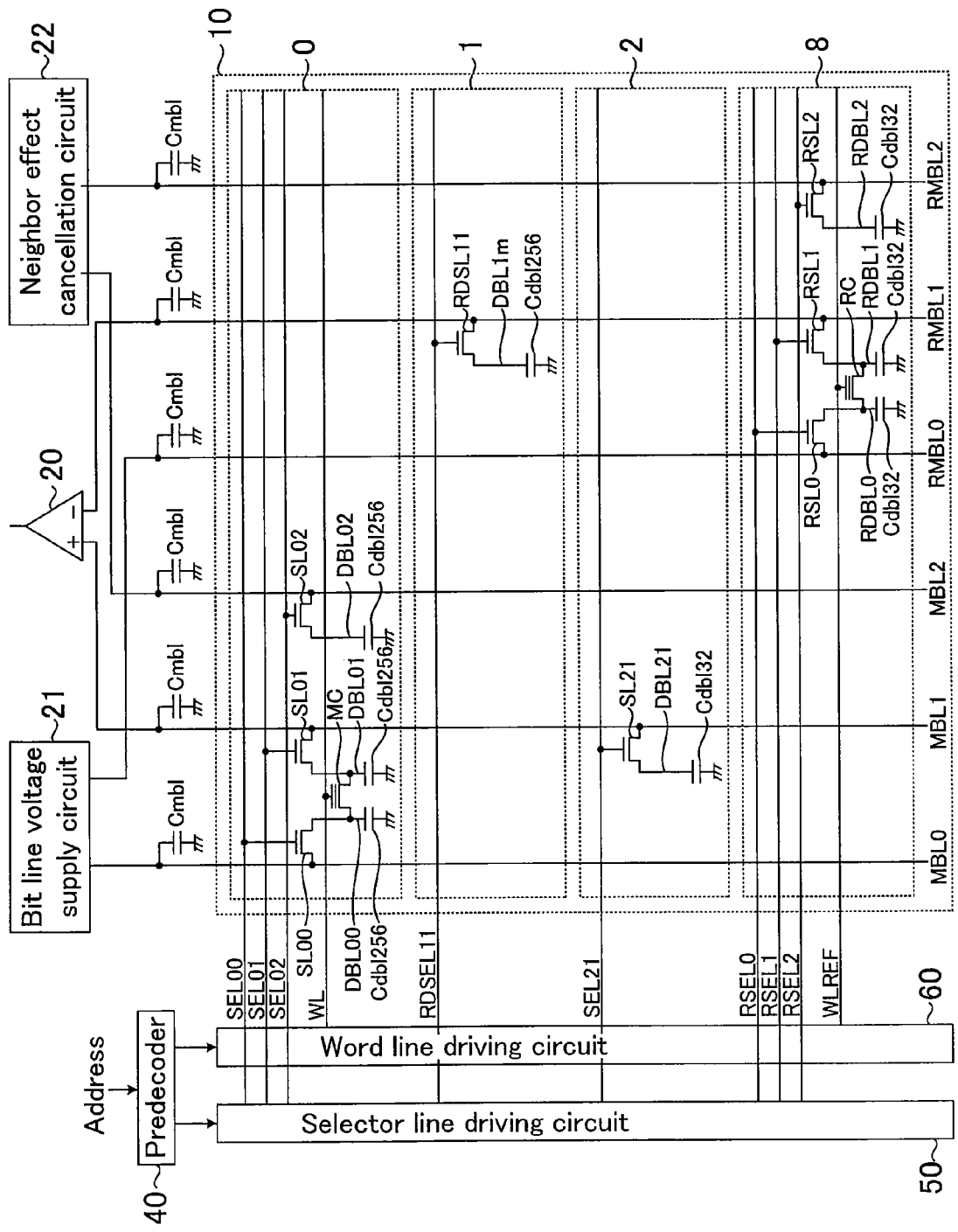
FIG. 14 is a diagram showing the parasitic capacitance of bit lines in a read operation of the semiconductor memory device according to Embodiment 3 of the present invention.

FIG. 14 is a diagram showing the parasitic capacitance of a bit line in a read operation of the semiconductor memory device according to Embodiment 3 of the present invention.

Referring to FIG. 14, a read operation of the semiconductor memory device having such a configuration will be described with respect to a case where data is read out from one of memory cells connected to the sub-bit lines DBL00 and DBL01 of the sector 0. It is assumed herein that the memory cell being read is the memory cell MC.

Where data is read out from the memory cell MC of the sector 0, the selector line driving circuit 50 selects selector lines SEL02 and RSEL2, in addition to the selector lines SEL00 and SEL01, the selector lines RSEL0 and RSEL1 and the selector lines RDSEL11 and SEL21.

When data is read out from the memory cell MC, the main bit line MBL0 is connected to the sub-bit line DBL00, as in Embodiment 1, and the main bit line MBL1 is connected to the sub-bit line DBL01 and the sub-bit line DBL21. With the semiconductor memory device of the present embodiment, the selector line SEL02 connected to the selection transistor SL02 is selected by the selector line driving circuit 50, whereby the adjacent sub-bit line DBL02 adjacent to the sub-bit line DBL01 connected to the sense amplifier 20 is connected to the main bit line MBL2.

The main bit line RMBL0 is connected to the sub-bit line RDBL0, to which the reference cell RC is connected, as in Embodiment 1, and the main bit line RMBL1 is connected to the sub-bit line RDBL1 and the sub-bit line DBL1$m$. At this point in time, with the semiconductor memory device of the present embodiment, the selector line RSEL2 connected to a selection transistor RSL2 is selected by the selector line driving circuit 50, whereby an adjacent sub-bit line RDBL2 adjacent to the sub-bit line RDBL1 connected to the sense amplifier 20 is connected to a main bit line RMBL2.

At this point in time, the main bit line MBL2 and the reference main bit line RMBL2 are connected to the neighbor effect cancellation circuit 22.

Referring to FIG. 9, the voltage of the source main bit line of the memory cell and that of the source main bit line of the reference cell each start increasing from the ground voltage when the sensing operation begins at time t2, according to the amount of current flowing through the memory cell or the reference cell. At the same time (at time t2), the neighbor effect cancellation circuit 22 injects a current into the main bit line MBL2 and the main bit line RMBL2 so that the potentials of the adjacent sub-bit lines DBL02 and RDBL2 become substantially the same as those of the source sub-bit lines DBL01 and RDBL1 of the memory cell and the reference cell. Therefore, the potential of the sub-bit line DBL01, to which the memory cell being read is connected, becomes substantially equal to that of the adjacent sub-bit line DBL02. Moreover, the potential of the sub-bit line RDBL1, to which the source of the reference cell is connected, is substantially equal to that of the adjacent sub-bit line RDBL2. As the neighbor effect cancellation circuit 22 operates as described above, the drain-source voltage of an adjacent memory cell to the memory cell MC being read and that of an adjacent memory cell to the reference cell RC both become substantially zero. Accordingly, there is substantially zero current flow through the adjacent memory cells. Thus, the current flow through adjacent memory cells is reduced by the neighbor effect cancellation circuit 22, whereby the "neighbor effect" is less likely to occur. Moreover, the semiconductor memory device of the present embodiment completely matches the total parasitic capacitances of the main bit lines connected to the sense amplifier, as in Embodiment 1, whereby data can be determined accurately.

As described above, when data is read out from a memory cell, the selector line driving circuit 50 of the present embodiment selects:

a pair of selector lines for connecting a first pair of main bit lines (a first main bit line and a second main bit line) with a first pair of sub-bit lines, to which the memory cell being read is connected;

a selector line for connecting a third main bit line connected to the neighbor effect cancellation circuit 22 with a sub-bit line adjacent to one of the first pair of sub-bit lines that is connected to the sense amplifier 20;

a selector line for connecting one of the first pair of main bit lines that is connected to the sense amplifier 20 with a sub-bit line of a second sector being different from a first sector, to which the memory cell being read belongs;

a pair of selector lines for connecting a second pair of main bit lines (a fourth main bit line and a fifth main bit line) with a second pair of sub-bit lines, to which the reference cell is connected;

a selector line for connecting a sixth main bit line connected to the neighbor effect cancellation circuit 22 with a sub-bit line adjacent to one of the second pair of sub-bit lines that is connected to the sense amplifier 20; and a selector line for connecting one of the second pair of main bit lines that is connected to the sense amplifier 20 with a sub-bit line of a third sector being different from the first sector and the second sector.

Therefore, with the selector line driving circuit 50 selecting as the second sector a sector of the same size as the reference sector, and selecting as the third sector a sector of the same size as the first sector, the total parasitic capacitances of the two main bit lines connected to the sense amplifier can be matched completely. The neighbor effect can also be reduced. Thus, data can be determined accurately.

Moreover, with the semiconductor memory device of the present embodiment, a sub-bit line for adjusting the parasitic capacitance is connected only to a main bit line that is connected to the sense amplifier in a read operation. Therefore, as compared with a case where a sub-bit line for adjusting the parasitic capacitance is connected to all the main bit lines connected to the memory cell being read or the reference cell, it is possible to reduce the number of selector lines to be driven and to reduce the power consumption in a read operation.

Embodiment 4

With the semiconductor memory device of Embodiment 3, when data is read out from the memory cell MC, the neighbor effect cancellation circuit 22 injects a predetermined current into the sub-bit line DBL02 and the sub-bit line RDBL2 as shown in FIG. 14. Thus, in a sensing operation, the potential of the sub-bit line DBL01, to which the source of the memory cell MC is connected, is substantially equal to that of the adjacent sub-bit line DBL02, and the potential of the sub-bit line RDBL1, to which the source of the reference cell RC is connected, is substantially equal to that of the adjacent sub-bit line RDBL2. Therefore, the currents flowing through adjacent memory cell to the memory cell MC and the adjacent memory cell to the reference cell RC are reduced.

The total parasitic capacitance of the main bit line MBL2, to which the neighbor effect cancellation circuit 22 is connected, is the sum of the parasitic capacitance Cmbl of the main bit line MBL2 and the parasitic capacitance Cdbl256 of the sub-bit line DBL02 of the sector 0 (Cmbl+Cdbl256). On the other hand, the total parasitic capacitance of the main bit line RMBL2, to which the neighbor effect cancellation circuit 22 is connected, is the sum of the parasitic capacitance Cmbl of the reference main bit line RMBL2 and the parasitic capacitance Cdbl32 of the sub-bit line RDBL2 of the reference sector (Cmbl+Cdbl32). As described above, the total parasitic capacitance of the main bit line MBL2 connected to the adjacent memory cell to the memory cell being read is different from that of the main bit line RMBL2 connected to the adjacent memory cell to the reference cell. Thus, with the same amount of current being injected by the neighbor effect cancellation circuit 22 into the main bit line MBL2 and the reference main bit line RMBL2, the adjacent sub-bit line DBL02 and the adjacent sub-bit line RDBL2 will have different potentials. Then, the degree of reduction in the neighbor effect for the memory cell being read will not completely match with that for the reference cell. Thus, it is possible that the semiconductor memory device cannot determine data accurately.

The semiconductor memory device of Embodiment 4 differs from the semiconductor memory device of Embodiment 3 with respect to the configuration of the selector line driving circuit. Otherwise, the configuration of the semiconductor memory device is similar to that of the semiconductor memory device of Embodiment 3. The selector line driving circuit of the present embodiment selects selector lines that are selected by the selector line driving circuit 50 of Embodiment 3 in a read operation, and also selects selector lines so that the total number of memory cells connected to a sub-bit line connected to one of the main bit lines into which a current is injected by the neighbor effect cancellation circuit 22 is equal to the number of memory cells connected to a sub-bit line connected to the other main bit line. Such a selection of selector lines is done no matter which memory cell is read.

Figure 15:
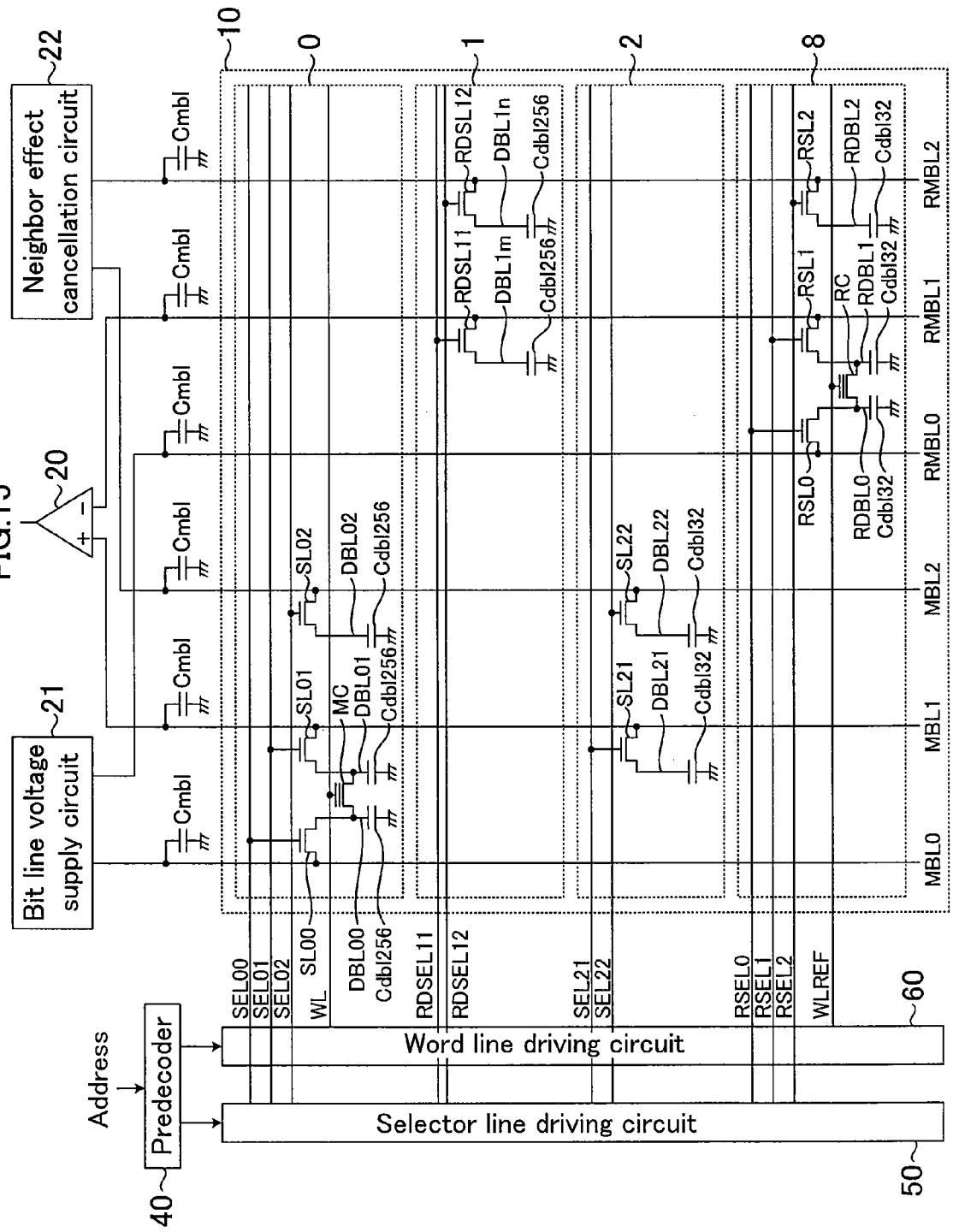
FIG. 15 is a diagram showing the parasitic capacitance of bit lines in a read operation of the semiconductor memory device according to Embodiment 4 of the present invention.

FIG. 15 is a diagram showing the parasitic capacitance of bit lines in a read operation of the semiconductor memory device according to Embodiment 4 of the present invention.

Referring to FIG. 15, a read operation of the semiconductor memory device having such a configuration will be described with respect to a case where data is read out from one of memory cells connected to the sub-bit lines DBL00 and DBL01 of the sector 0. It is assumed herein that the memory cell being read is the memory cell MC.

When data is read out from the memory cell MC of the sector 0, the selector line driving circuit 50 selects the selector lines SEL00 and SEL01, the selector lines RSEL0 and RSEL1, the selector lines SEL21 and RDSEL11, the selector lines SEL02 and SEL22 and the selector lines RSEL2 and RDSEL12.

When data is read out from the memory cell MC, the sub-bit line DBL01 and the sub-bit line DBL21 of the sector 2 are connected to the main bit line MBL1. Moreover, a sub-bit line DBL22 of the sector 2 is connected to the main bit line MBL2, to which the neighbor effect cancellation circuit 22 is connected, for adjusting the total parasitic capacitance of the main bit line MBL2, in addition to the adjacent sub-bit line DBL02 adjacent to the sub-bit line DBL01.

The sub-bit line RDBL1 and the sub-bit line DBL1*m* of the sector 1 are connected to the main bit line RMBL1. Moreover, the sub-bit line DBL1*n* of the sector 1 is connected to the main bit line RMBL2, to which the neighbor effect cancellation circuit 22 is connected, for adjusting the total parasitic capacitance of the main bit line RMBL2, in addition to the adjacent sub-bit line RDBL2 adjacent to the sub-bit line RDBL1.

As described above, with the semiconductor memory device of the present embodiment, not only the total parasitic capacitances of two main bit lines connected to the sense amplifier 20, but also the total parasitic capacitances of two main bit lines, into which a current is injected by the neighbor effect cancellation circuit 22, are matched with each other. Thus, the degree of reduction in the neighbor effect for the memory cell being read is completely matched with that for the reference cell, whereby the semiconductor memory device can read out data accurately.

As described above, when data is read out from a memory cell, the selector line driving circuit 50 of the present embodiment selects:

a pair of selector lines for connecting a first pair of main bit lines (a first main bit line and a second main bit line) with a first pair of sub-bit lines, to which the memory cell being read is connected;

a selector line for connecting a third main bit line connected to the neighbor effect cancellation circuit 22 with a sub-bit line adjacent to one of the first pair of sub-bit lines that is connected to the sense amplifier 20;

a selector line for connecting one of the first pair of main bit lines that is connected to the sense amplifier 20 with a sub-bit line of a second sector being different from a first sector, to which the memory cell being read belongs;

a selector line for connecting the third main bit line with the sub-bit line of the second sector;

a pair of selector lines for connecting a second pair of main bit lines (a fourth main bit line and a fifth main bit line) with a second pair of sub-bit lines, to which the reference cell is connected;

a selector line for connecting a sixth main bit line connected to the neighbor effect cancellation circuit 22 with a sub-bit line adjacent to one of the second pair of sub-bit lines that is connected to the sensing means;

a selector line for connecting one of the second pair of main bit lines that is connected to the sense amplifier 20 with a sub-bit line of a third sector being different from the first sector and the second sector; and a selector line for connecting the sixth main bit line with the sub-bit line of the third sector.

Therefore, with the selector line driving circuit 50 selecting as the second sector a sector of the same size as the reference sector, and selecting as the third sector a sector of the same size as the first sector, the total parasitic capacitances of the two main bit lines connected to the sensing means can be matched completely. Moreover, the selector line driving circuit 50 selects selector lines so that the degree of reduction in the neighbor effect for the memory cell being read is totally equal to that for the reference cell, whereby the semiconductor memory device can determine data accurately.

Other Embodiments

With the semiconductor memory devices of Embodiments 3 and 4, sub-bit lines of one sector other than the sector being read are connected to the main bit line to which the memory cell is connected and the main bit line to which the reference cell is connected in order to adjust the total parasitic capacitance of the main bit line. Alternatively, sub-bit lines of a plurality of sectors other than the sector being read may be connected to the main bit line to which the memory cell is connected and the main bit line to which the reference cell is connected in order to adjust the total parasitic capacitance of the main bit line, as in Embodiment 2.

With the semiconductor memory device of Embodiments 2 to 4, the selector line driving circuit 50 may drive a plurality of selector lines over a plurality of points in time in a read operation by driving a subset of selector lines at a time, as in Embodiment 1.

While preferred embodiments of the present invention have been described above, the semiconductor memory device of the present invention is not limited to these illustrative embodiments, and various changes, etc., may be made thereto without departing from the scope of the present invention.

For example, while the semiconductor memory device of each embodiment above is directed to a flash memory example, the present invention can also be applicable to semiconductor memory devices other than a flash memory, such as mask ROMs. While the semiconductor memory device of each embodiment above is directed to a source sensing example where the source terminals of the memory cell and the reference cell are sensed, the present invention can also be applicable to a semiconductor memory device of a drain sensing type where the drain terminals of the memory cell and the reference cell are sensed.

With the semiconductor memory device of each embodiment above, when a sub-bit line that is connected to the memory cell being read is connected to a main bit line, a sub-bit line of a sector different from the sector being read is connected to the main bit line in order to adjust the total parasitic capacitance of the main bit line. However, in order to adjust the total parasitic capacitance of the main bit line, the main bit line may be connected to a sub-bit line dedicated for capacitance adjustment to which a dummy cell, a capacitor element, or the like, is connected.

While the semiconductor memory device of each embodiment above includes a memory cell array being a virtual ground array, the present invention can also be applicable to a semiconductor memory device including a memory cell array of an NOR type, a DINOR type, a NAND type or an AND type. With a memory cell array being a virtual ground array, a read operation is performed as sub-bit lines that are connected to the drains and the sources of the memory cell and the reference cell are connected to main bit lines by means of selection transistors. Alternatively, the present invention is applicable to a semiconductor memory device having a memory cell array, in which the source of the memory cell is pre-fixed to a predetermined voltage (e.g., the ground voltage), wherein a read operation is performed as sub-bit lines that are connected to the drains of the memory cell and the reference cell are connected to main bit lines by means of selection transistors.

The semiconductor memory device of the present invention is useful as a flash memory, a mask ROM, or the like, for example, with the advantageous effect that data can be read out accurately.

What is claimed is:

1. A semiconductor memory device, comprising:
   a memory cell array being a virtual ground array and including a plurality of memory cells arranged in a row direction and in a column direction to thereby form a matrix pattern, the memory cell array being divided into a plurality of sectors;
   a plurality of word lines each provided for one row of memory cells;
   a plurality of main bit lines extending in the column direction;
   a plurality of sub-bit lines extending in the column direction and each provided within a sector;
   a plurality of selection transistors corresponding to the sub-bit lines for electrically controlling connections between the main bit lines and the sub-bit lines;
   a plurality of selector lines for controlling a conductivity state of the selection transistors;
   a reference cell for producing a reference voltage used in a read operation;
   a sense amplifier, to which the main bit lines are connected, for determining readout data;
   a word line selection circuit for selecting a word line to which one of the memory cells that is being read is connected and a word line to which the reference cell is connected; and
   a selector line selection circuit for selecting, in a read operation,
   a selector line for connecting a first pair of main bit lines with a pair of sub-bit lines to which the memory cell being read is connected,
   a selector line for connecting one of the first pair of main bit lines that is connected to the sense amplifier with a sub-bit line of at least one sector different from a sector to which the memory cell being read belongs,
   a selector line for connecting a second pair of main bit lines with a pair of sub-bit lines to which the reference cell is connected, and
   a selector line for connecting one of the second pair of main bit lines that is connected to the sense amplifier with a sub-bit line of at least one sector different from the sector to which the memory cell being read belongs.

2. The semiconductor memory device of claim 1, wherein the selector line selection circuit selects the selector lines so that a parasitic capacitance on one of the first pair of main bit lines that is connected to the sense amplifier is equal to that on one of the second pair of main bit lines that is connected to the sense amplifier.

3. The semiconductor memory device of claim 1, wherein the plurality of sectors include a set of sectors having the same sub-bit line parasitic capacitance.

4. The semiconductor memory device of claim 1, wherein the plurality of sectors include a set of sectors having the same number of word lines.

5. The semiconductor memory device of claim 1, wherein the selector line selection circuit first selects a subset of selector lines among all the selector lines to be selected, and then selects remaining selector lines after passage of a predetermined amount of time.

6. The semiconductor memory device of claim 5, wherein the subset of selector lines include a selector line for connecting together a main bit line and a sub-bit line to be precharged.

* * * * *